US010141493B2

(12) United States Patent
Tuckerman

(10) Patent No.: US 10,141,493 B2
(45) Date of Patent: Nov. 27, 2018

(54) THERMAL MANAGEMENT FOR SUPERCONDUCTING INTERCONNECTS

(71) Applicant: Microsoft Technology Licensing, LLC, Redmond, WA (US)

(72) Inventor: David B. Tuckerman, Lafayette, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/836,667

(22) Filed: Dec. 8, 2017

(65) Prior Publication Data
US 2018/0294401 A1 Oct. 11, 2018

Related U.S. Application Data

(60) Provisional application No. 62/484,326, filed on Apr. 11, 2017.

(51) Int. Cl.
*H01L 39/02* (2006.01)
*H01B 12/02* (2006.01)
*H01B 3/30* (2006.01)

(52) U.S. Cl.
CPC ............ *H01L 39/02* (2013.01); *H01B 3/306* (2013.01); *H01B 12/02* (2013.01)

(58) Field of Classification Search
None
See application file for complete search history.

(56) References Cited

U.S. PATENT DOCUMENTS 4,177,476 A * 12/1979 Kroger ................. H01L 39/223
257/35
4,242,534 A * 12/1980 Marsing ................. H01B 12/02
156/51

(Continued)

FOREIGN PATENT DOCUMENTS

| CN | 101888026 A | 11/2010 |
| WO | 0225672 A2 | 3/2002 |

OTHER PUBLICATIONS

Assali, et al., "Hyperfine interactions in silicon quantum dots", In Journal of Physical review B, vol. 83, No. 16, Apr. 4, 2011, pp. 1-6.

(Continued)

*Primary Examiner* — Dimary Lopez Cruz
*Assistant Examiner* — Muhammed Azam
(74) *Attorney, Agent, or Firm* — Ranjeev Singh; Singh Law, PLLC

(57) ABSTRACT

An interconnect may have a first end coupled to a superconducting system and a second end coupled to a non-superconducting system. The interconnect may include a superconducting element having a critical temperature. During operation of the superconducting system and the non-superconducting system, a first portion of the interconnect near the first end may have a first temperature equal to or below the critical temperature of the superconducting element, a second portion of the interconnect near the second end may have a second temperature above the critical temperature of the superconducting element, and the interconnect may further be configured to reduce a length of the second portion such that temperature substantially over an entire length of the interconnect is maintained at a temperature equal to or below the critical temperature of the superconducting element.

20 Claims, 17 Drawing Sheets

(56) References Cited

U.S. PATENT DOCUMENTS

| | | | | |
|---|---|---|---|---|
| 4,366,494 A * | 12/1982 | Ohta | ................ | H01L 39/223 257/34 |
| 4,660,061 A * | 4/1987 | Sweeny | ................ | H01L 39/04 257/32 |
| 5,110,034 A * | 5/1992 | Simmonds | ................ | H01L 39/02 174/94 R |
| 5,326,988 A * | 7/1994 | Ishida | ................ | H01L 39/146 257/288 |
| 5,386,870 A * | 2/1995 | Nieman | ................ | F28F 13/00 165/185 |
| 5,571,602 A * | 11/1996 | Eckels | ................ | G01R 33/421 29/599 |
| 5,773,875 A * | 6/1998 | Chan | ................ | H01L 23/445 257/661 |
| 5,793,056 A * | 8/1998 | Forrester | ................ | H01L 39/225 257/31 |
| 5,821,556 A * | 10/1998 | Chew | ................ | H01L 39/225 257/31 |
| 6,051,846 A * | 4/2000 | Burns | ................ | H01L 27/1214 257/31 |
| 6,088,604 A * | 7/2000 | Williams | ................ | H01L 29/437 257/32 |
| 6,304,538 B1 * | 10/2001 | Hayashi | ................ | G11B 7/005 369/124.05 |
| 6,352,741 B1 * | 3/2002 | Chan | ................ | H01L 23/53285 257/E23.156 |
| 6,353,234 B1 * | 3/2002 | Faley | ................ | H01L 39/2422 257/31 |
| 6,438,967 B1 * | 8/2002 | Sarwinski | ................ | F25D 19/006 165/185 |
| 6,642,608 B1 * | 11/2003 | Hu | ................ | H01L 27/18 257/30 |
| 9,880,365 B2 * | 1/2018 | Goutzoulis | ................ | G02B 6/4248 |
| 2005/0062131 A1 * | 3/2005 | Murduck | ................ | H01C 7/006 257/536 |
| 2005/0092981 A1 * | 5/2005 | Hunt | ................ | H01L 27/18 257/31 |
| 2006/0072254 A1 * | 4/2006 | Sargent | ................ | H01L 39/16 361/19 |
| 2006/0240991 A1 * | 10/2006 | Takahashi | ................ | H01L 39/02 505/300 |
| 2008/0278166 A1 * | 11/2008 | Wosik | ................ | G01R 33/34007 324/318 |
| 2010/0087322 A1 * | 4/2010 | Yuan | ................ | H01B 12/16 505/163 |
| 2010/0184604 A1 * | 7/2010 | Roden | ................ | H01L 39/02 505/237 |
| 2010/0210468 A1 * | 8/2010 | Lee | ................ | H01L 39/02 505/410 |
| 2013/0082804 A1 * | 4/2013 | Kawaguchi | ................ | H01L 39/143 333/99 S |
| 2014/0100119 A1 * | 4/2014 | Schlenga | ................ | H01L 41/06 505/236 |
| 2014/0110848 A1 * | 4/2014 | Taylor | ................ | H01L 24/29 257/766 |
| 2016/0125311 A1 * | 5/2016 | Fuechsle | ................ | G06N 99/002 257/31 |
| 2017/0123171 A1 * | 5/2017 | Goutzoulis | ................ | G02B 6/325 |

OTHER PUBLICATIONS

Bonderson, et al., "Topological quantum buses: coherent quantum information transfer between topological and conventional qubits", In Journal of Physical review Letters, vol. 106, No. 13, Mar. 28, 2011, pp. 1-5.

Brummer, et al., "Phase and Amplitude Modulator for Microwave Pulse Generation", In Journal of IEEE Transactions on Applied Superconductivity, vol. 21, Issue 3, Jun. 2011, pp. 583-586.

Camin, et al., "Cryogenic Behavior of Optoelectronic Devices for the Transmission of Analog Signals via Fiber Optics", In Journal of IEEE Transactions on Nuclear Science, vol. 53, Issue 6, Dec. 2006, pp. 3929-3933.

Cavallaro, et al., "A 3-5-GHz UWB Front-End for Low-Data Rate WPANs in 90-nm CMOS", In Journal of IEEE Transactions on Microwave Theory and Techniques, vol. 58, Issue 4, Apr. 2010, pp. 854-865.

Cavallaro, et al., "An ultra-wideband transmitter based on a new pulse generator", In Proceedings of IEEE Radio Frequency Integrated Circuits Symposium, Jun. 17, 2008, pp. 43-46.

Chang, et al., "High-efficiency, high-speed VCSELs with 35 Gbit/s error-free operation", In Journal of Electronics Letters, vol. 43, Issue 19, Sep. 13, 2007, 2 Pages.

Gambetta, et al., "Analytic control methods for high fidelity unitary operations in a weakly nonlinear oscillator", In Journal of Physical review A, vol. 83, No. 1, Jan. 18, 2011, pp. 1-15.

Goncher, et al., "Cryogenic operation of AlGaAs—GaAs vertical-cavity surface-emitting lasers at temperatures from 200 K to 6 K", In Journal of IEEE Photonics Technology Letters, vol. 8, Issue 3, Mar. 1996, pp. 316-318.

Groszkowski, et al., "Tunable coupling between three qubits as a building block for a superconducting quantum computer", In Journal of Physical review B, vol. 84, No. 14, Oct. 17, 2011, pp. 1-8.

Krisfinamoorthy, Ashok V., "Overview of short-reach optical interconnects: From VCSELs to silicon nanophotonics", In Proceedings of IEEE Hot Chips Symposium, Aug. 22, 2010, 31 Pages.

Lebrun, Philippe, "Superconductivity and ancillary cryogenics at CERN: from bubble chambers to accelerators", In Proceedings of the CERN Centennial Superconductivity Symposium, Dec. 8, 2011, 43 Pages.

Maune, et al., "Coherent singlet-triplet oscillations in a silicon-based double quantum dot", In Journal of Nature, vol. 481, Issue 7831, Jan. 19, 2012, pp. 344-347.

Motzoi, et al., "Optimal control methods for fast time-varying Hamiltonians", In Journal of Physical review A, vol. 84, No. 2, Aug. 4, 2011, pp. 1-10.

Motzoi, et al., "Simple pulses for elimination of leakage in weakly nonlinear qubits", In Journal of Physical review Letters, vol. 103, No. 11, Sep. 8, 2009, pp. 1-4.

Mutig, et al., "Progress on High-Speed 980nm VCSELs for Short-Reach Optical Interconnects", In Journal of Advances in Optical Technologies, vol. 2011, Jul. 2011, pp. 1-15.

Prance, et al., "Single-shot measurement of triplet-singlet relaxation in a Si/SiGe double quantum dot", In Journal of Physical review Letters, vol. 108, No. 4, Jan. 26, 2012, pp. 1-6.

Qin, et al., "A programmable 1.8pJ/pulse Gaussian pulse generator for impulse UWB transceiver in 90nm CMOS", In Proceedings of IEEE Radio and Wireless Symposium, Jan. 18, 2009, pp. 498-501.

Shi, et al., "A fast "hybrid" silicon double quantum dot qubit", In Journal of Physical review Letters, vol. 108, No. 14, Apr. 4, 2012, pp. 1-12.

Taubenblatt, Marc A., "Optical interconnects for high performance computing", In Journal of Lightwave Technology, vol. 30, Issue 4, Feb. 15, 2012, pp. 448-458.

Wentzloff, et al., "Gaussian Pulse Generators for Subbanded Ultra-Wideband Transmitters", In Journal of IEEE Transactions on Microwave Theory and Techniques, vol. 54, No. 4, Apr. 2006, pp. 1647-1655.

Gupta, et al., "Preserving Niobium Superconductivity in Thin-Film Superconducting Flexible Cables", In Additional conferences (Device Packaging, HiTEC, HiTEN, & CICMT), Jan. 2016, 3 Pages.

Weers, et al., "Niobium flex cable for low temperature high density interconnects", In Journal of Cryogenics, vols. 55-56, May 2013, pp. 1-4.

Tuckerman, et al., "Flexible superconducting Nb transmission lines on thin film polyimide for quantum computing applications", In Journal of Superconductor Science and Technology, vol. 29, No. 8, Jul. 11, 2016, pp. 1-12.

Burnell, et al., "Nanoscale Superconductor-Normal Metal-Superconductor Junctions Fabricated by Focused Ion Beam", Published in Physica C: Superconductivity, vol. 372-376, Aug. 1, 2002, pp. 14-17.

(56) References Cited

OTHER PUBLICATIONS

"International Search Report and Written Opinion Issued in PCT Application No. PCT/US2018/025617", dated Jul. 18, 2018, 12 Pages.

* cited by examiner

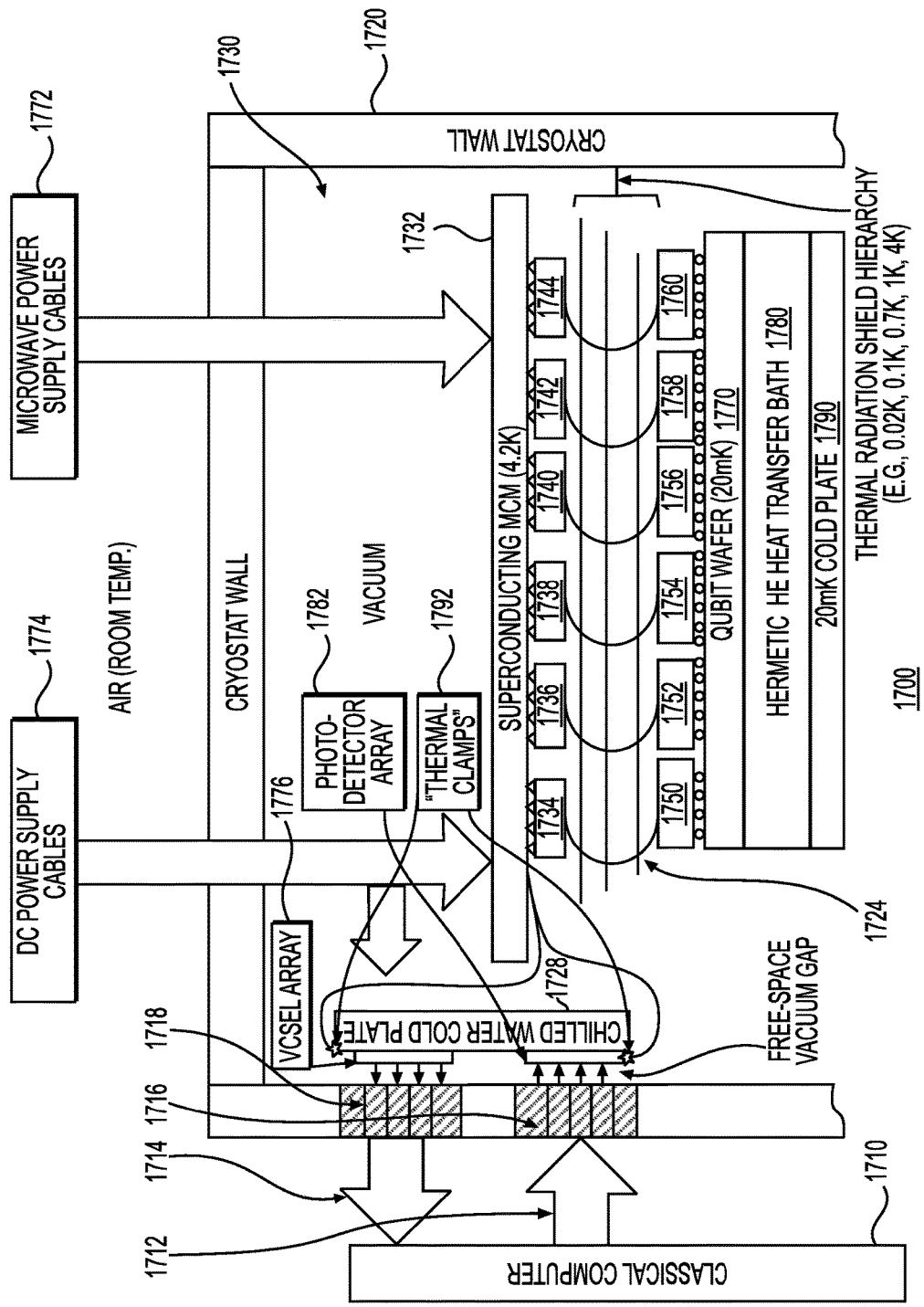

THERMAL MANAGEMENT FOR SUPERCONDUCTING INTERCONNECTS

CROSS-REFERENCE TO A RELATED APPLICATION

This application claims the benefit of U.S. Provisional Application No. 62/484,326, filed Apr. 11, 2017, titled "THERMAL MANAGEMENT FOR SUPERCONDUCTING INTERCONNECTS," the entire contents of which are hereby incorporated herein by reference.

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An additional approach to the use of processors and related components, based on CMOS technology, is the use of superconducting logic based devices. Superconducting logic based devices can also be used to process quantum information, such as qubits. Unlike CMOS devices that can operate at room-temperature, superconducting logic based devices require lower temperatures to function properly. In many applications, superconducting logic based devices and CMOS devices may need to be interconnected to each other. Similarly, superconducting logic based modules may need to be interconnected with each other or other modules that may operate at further lower temperatures.

SUMMARY

In one example, the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system, such that during operation of the superconducting system and the non-superconducting system, a first portion of the interconnect near the first end having a first temperature equal to or below the critical temperature of the superconducting element, a second portion of the interconnect near the second end having a second temperature above the critical temperature of the superconducting element, and where the interconnect is further configured to reduce a length of the second portion such that temperature substantially over an entire length of the interconnect is maintained at a temperature equal to or below the critical temperature of the superconducting element.

In another example, the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system. The interconnect may further comprise a first layer comprising at least the superconducting element and a second layer comprising a non-superconducting metal element, where a thickness of the second layer is varied along a length-wise direction of the interconnect such that during operation of the superconducting system and the non-superconducting system temperature substantially over an entire length of the interconnect is maintained at a temperature equal to or below the critical temperature of the superconducting element.

In another example, the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system. The interconnect may further comprise a first layer comprising a dielectric, the first layer having a first edge along a length-wise direction of the interconnect and a second edge opposite to the first edge along the length-wise direction of the interconnect. The interconnect may further comprise a first differential pair of superconductors comprising at least the superconducting element, the first differential pair formed along the length-wise direction of the interconnect and the first differential pair formed closer to the first edge than the second edge. The interconnect may further comprise a second differential pair of superconductors comprising at least the superconducting element, the second differential pair formed along the length-wise direction of the interconnect and the second differential pair formed closer to the second edge than the first edge. The interconnect may further comprise a non-superconductor metal formed along the length-wise direction of the interconnect, between the first differential pair and the second differential pair, where a thickness of the non-superconductor metal is selected such that during operation of the superconducting system and the non-superconducting system temperature substantially over an entire length of the interconnect is maintained at a temperature equal to or below the critical temperature of the superconducting element.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 17 shows a diagram of a system in accordance with one example.

DETAILED DESCRIPTION

Figure 1:
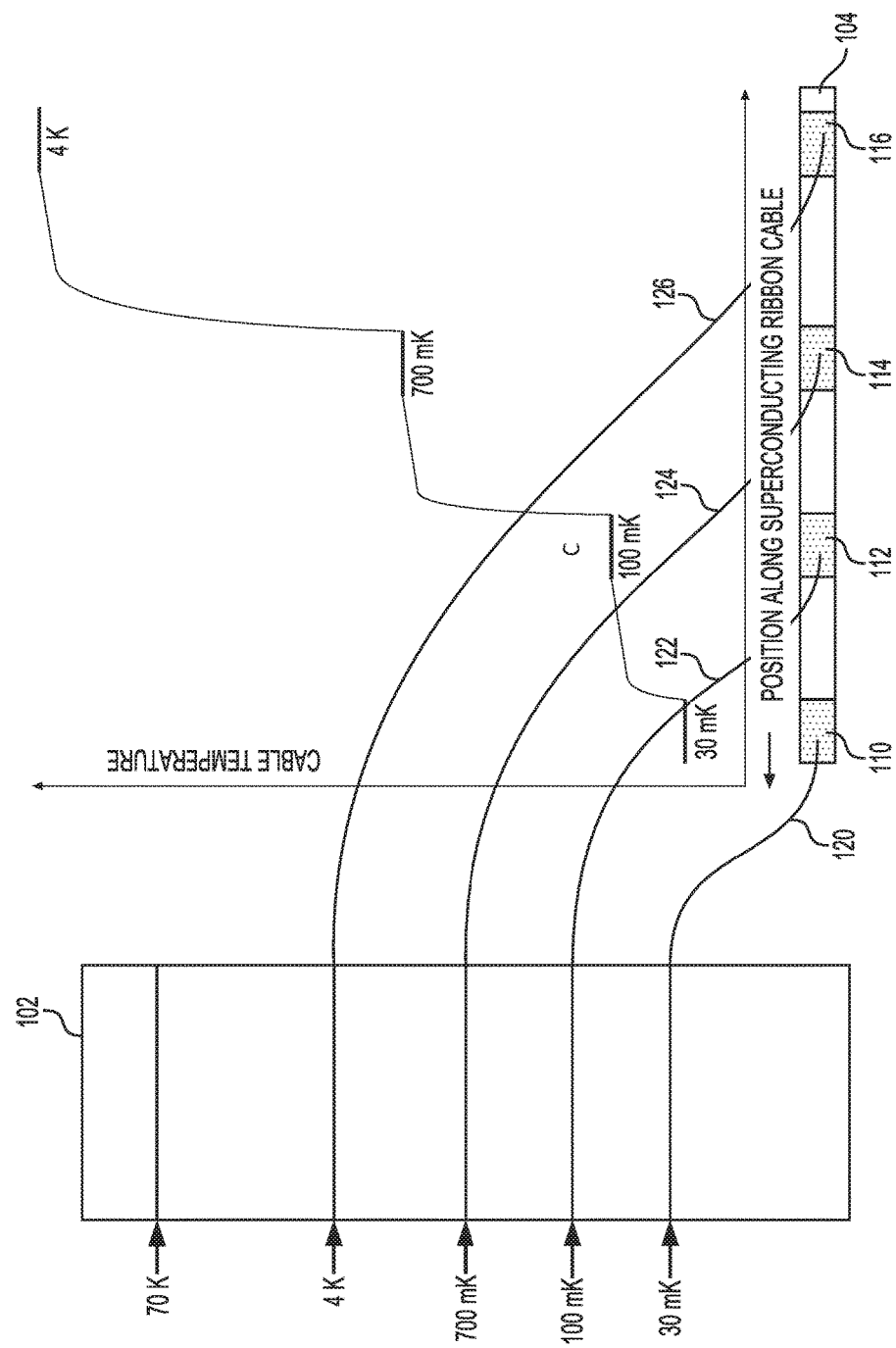
FIG. 1 shows an approximate temperature profile of an interconnect in accordance with one example.

Examples described in this disclosure relate to superconducting interconnects, including flexible-substrate based superconducting interconnects. Such interconnects may be used to couple superconducting logic based modules. As an example, such interconnects may provide electrical connections among modules within a superconducting logic based system that may operate in an approximately 4 Kelvin (~4 K) thermal environment. These interconnects may also be used to couple superconducting logic based devices with CMOS-based or other types of devices that may operate in an approximately 70 Kelvin (~70 K) thermal environment. In addition, such interconnects may also be used to couple superconducting logic based devices (operating in an approximately 4 Kelvin (~4 K) degrees thermal environment) with quantum computing devices that may operate at much lower temperatures, e.g., approximately 20 milli-Kelvin (~20 mK). The quantum computing devices may process quantum information, e.g., qubits. The superconducting logic devices may include low-power superconductor logic circuits. Unlike CMOS transistors, the superconductor logic circuits may use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Such materials have zero DC resistance and very low resistance at the frequencies at which high-speed classical and quantum computing circuits operate (order of magnitude 10 GHz). As an exemplary superconductor, niobium (Nb) has a critical temperature (Tc) of approximately 9.2 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be aluminum oxide barriers. In SIS type of junctions, when a wave function tunnels through the barrier, a changing phase difference in time in the two superconductors creates a potential difference between the two superconductors. In one example, the SIS type of junction may be part of a superconducting loop. In certain examples, microwave signals may be used to control the superconducting logic based devices including, for example, the state of superconducting quantum bits (qubits). Many implementations of the gates for superconducting quantum bits (qubits) require high-frequency microwave signals.

When such superconducting logic based systems are connected to other types of logic based systems, such as systems based on CMOS devices, they need to be interconnected via high-speed communication links. In one example, such communication links may be fiber-optical, copper, or another type of communication link. In one example, such communication links may need to operate at 10-100 Gigabits per second (Gbits/s). In one example, a system operating in a cryogenic environment may require a vacuum to operate properly. In one example, a vacuum may relate to a pressure in a range of $10^{-3}$ Torr to $10^{-10}$ Torr.

Examples described in this disclosure further relate to a superconducting flexible interconnect used to connect between circuitries at two different temperatures (e.g., referred to as "cold" and "warm") which are, respectively, below and above the superconducting transition temperature Tc of the conductors (e.g., Nb) in the cable. For a given DC electrical resistance, the heat leakage is set mainly by the Wiedemann-Franz law, which establishes a proportionality between electrical conductivity and thermal conductivity. Signal attenuation for high-frequency RF signals, however, is determined by the high-frequency electrical resistance, which is typically much larger than the DC electrical resistance in conventional cables. In order to achieve the best possible heat leakage, limited only by the Wiedemann-Franz law, one may need a cable where the DC electrical resistance is comparable to the RF resistance. This can only occur if the conductors in the cable are thin relative to the skin depth at the frequencies of interest (typically sub-micron dimensions at GHz frequencies). But this in turn means that the cable would need to be extremely short in order to have acceptably low resistance.

To provide an acceptably low electrical loss (i.e., low resistance), the temperature of the cable may be engineered so that almost its entire length is maintained below Tc, with only a relatively short portion near the warm end allowed to rise above Tc. This may be accomplished either by applying an external mechanical clamp to the cable near the warm end that is maintained below Tc, or by incorporating a highly thermally conductive path (e.g., a Cu plane) within the cable itself that begins at the cold end of the cable and extends most of the way towards the warm end, so that only a relatively short length of the cable near the warm end has a temperature above Tc. Thus, as an example, the thermal clamp solves the problem created by the high RF resistance by effectively creating two cables in series: one is long and superconducting, and the other is short and made of normal metal. In sum, the disclosure relates, in one aspect, to modifying the heat conduction pathways in the cables to artificially maintain them at a low temperature for most of their length, so that the thermal transition region is a relatively short length near the warm end. If the low-temperature portion of the cable contains superconductors, then we get the advantages of nearly lossless signal propagation over superconducting transmission lines for nearly the entire length of the cable, with only a relatively short series resistance occurring at the warm end. These solutions may advantageously allow high-speed communication between a superconducting computer and electronic (e.g., CMOS-based electronics) components operating at a warmer temperature.

Compared with conventional copper coaxial cables, superconducting flexible impedance-controlled cables such as microstrip, stripline, or coplanar waveguides permit the transmission of high-speed electrical signals over long distances with minimal loss. In addition, their physical cross section can be very small, so that large numbers of signals can be transmitted in a single compact ribbon cable. However, the performance advantages may be lost if the cable temperature exceeds Tc, such as occurs when connecting from the cryogenic environment to higher temperature electronics. As soon as the cable temperature exceeds Tc, the small conductor cross sections may develop very high resistance per unit length. However, if the temperature along most of the cable length below may be maintained below Tc, the length of this normal segment can be short enough that its resistance is acceptable (e.g., less than 50 ohms of series resistance). In one example, physically clamping the cable near the warm end with a cold finger or cold plate can achieve this effect. Alternatively, the same effect can be achieved without an external mechanical clamp by incorporating a highly thermally conductive path (for example a thick copper plane with high residual resistance ratio (RRR)) in the cable, beginning at the cold end of the cable and extending most of the length of the cable. In some situations, the high-temperature normal-state resistance of the superconductor may be so high that the thermal clamp needs to be extremely close (a few mm or less) to the warm end to achieve acceptably low series resistance, which may present practical difficulties. In this situation, one can instead change the conductive path to copper in the zone that is going to be above Tc, which permits a longer transition region (several cm) that is more practical to implement.

One of the limitations to constructing densely-integrated cryogenic electronic systems is the electrical interconnect technology. Dense superconducting cables with small cross-sections may be needed. The superconducting characteristics of thin-film niobium (Nb) make it a viable material for realizing superconducting cables. Flexible superconducting cables can have more practical use and wider application prospects than interconnects on rigid substrates. One concern is that Nb thin films are susceptible to cracking and delamination from the underlying substrate, especially when subjected to flexing as in the case of a flexible cable. Titanium may be used as an adhesion and transition layer for subsequently deposited metal layers. Copper, as an excellent electrical and thermal conductor with superior ductility, may be deposited on top of the Nb thin film to protect it from cracking, potentially mend cracking damage and provide enhanced thermalization to achieve better cable performance at superconducting temperatures, as well as at room temperature.

Certain examples in this disclosure relate to the thermal management of superconducting interconnects fabricated on flexible substrates, including, for example, niobium (Nb, Tc~9.2 K) or related alloys such as niobium-nitride (NbN) or niobium-titanium-nitride (NbTiN). Certain examples relate to composite superconductor/normal conductor (e.g., Nb/Ti/Cu) thin-film flexible cables. In such examples, the conductive layers may be a laminate of a superconductor (e.g., niobium or niobium nitride) and a highly conductive ductile normal metal (e.g., copper (thickness may range from 10 nm to a higher thickness depending upon the application)). Such cables, which are capped (or, e.g., clad) with copper, may advantageously have a higher manufacturing yield. Certain examples may relate to highly parallel interconnects that are usable for either low-frequency DC signals (e.g., bias currents) or high-frequency radio frequency signals (e.g., 10 GHz signals) applications. The disclosure also discusses modifying the cable's mechanical and electrical properties by introducing additional normal metal layers such as titanium (Ti) and copper (Cu). In certain examples, the superconducting material may be deposited directly on free-standing polyimide films such as Kapton film, or it may be deposited on thin-film polyimide dielectrics atop a rigid substrate wafer; in the latter case, the cable is later released from the substrate wafer. As an example, using multilayer thin-film processing, transmission lines (including microstrip, strip-line, and coplanar transmission lines) may be formed.

In one example, flexible superconducting cables may be fabricated using a glass substrate. An initial polyimide film (e.g., Pyralin PI-2611) may be spin-coated on the glass substrate. Using a plasma process, followed by a physical vapor deposition (PVD) process, a thin Ti film may be applied to the cured polyimide film. Next, a superconductive metal layer, e.g., a niobium layer may be deposited. Next, the Ti/Nb stack may be capped with a copper layer (other normal conductors, such as gold or silver may also be used). Finally, lithography and thin-film processing techniques may be used to pattern tracks of conductors. A polyimide layer may then be applied and cured on top of the conductors. These processes may be repeated to form a structure with multiple conductor layers.

A superconducting 'rectangular coax' ribbon cable may be used to connect a module operating in a thermal environment at ~20 mK and a module operating in a thermal environment at ~4 K. It could even terminate at a room temperature circuit board containing optoelectronic transceivers if a thermal clamp is used near the termination to keep the non-superconducting portion extremely short (few mm). Both faces of the ribbon may be clad with a planar superconducting shield, except for occasional holes to pin trapped flux (resulting from residual magnetic fields in the cryostat). The holes may be formed using reactive-ion-etch or other thin-film processing techniques. Superconducting shields (walls) may be positioned between adjacent superconducting signal wires, assuring zero measurable crosstalk. The conductors may only be a few microns wide and ~1 μm thick, which would advantageously yield a very high interconnect density (~500 or 1000 signals in a 1 cm width), excellent mechanical flexibility, and very low axial heat leakage when in the superconducting state. In this example, niobium (Nb; Tc=9.2 K) is a preferred superconductor. Either conventional single-ended or differential pairs may be used. The terminations could be bonded to a chip using superconducting solder (for example, Pb or In), either in a closely spaced linear array for contact near the edge of a chip, or in a less densely spaced 2-dimensional array which would mate to the face of the chip (it may be convenient to have a separate chip at the end of the cable whose sole function is to provide 'space transformation' from closely spaced linear wires to a 2-dimensional area array with less aggressive spacing). The example depicted here is approximately 50Ω in impedance; however, that may not be required if, for example, the design is intended entirely for internal connections between qubits, superconducting circuits, and electro/optical transceivers. In quantum computing applications, the termination scheme may be arranged so that all of the terminating resistors are on the 4 K end, to minimize hot electron generation at 20 mK. This arrangement would result in a 'series termination' for signals going to the qubits, and a 'parallel termination' for signals coming from the qubits.

As noted earlier, while niobium (Nb) is the simplest and the most appropriate superconductor for many applications, other materials, including alloys, may also be used. As an example, NbN or NbTiN can be also be used, provided that their much higher kinetic inductance is compatible with the intended use. High-temperature superconductor (HTSC) materials, such as YBCO or BSCCO may also be used to provide superconducting interconnect from low temperatures to ~70 K.

Such flexible multi-conductor ribbon cables may have several uses in cryogenic computing: (1) as electrical connections within a ~4 K thermal environment (e.g., interconnecting modules within a Josephson junction computer); (2) as connections between the ~4 K environment and higher temperatures (e.g., for interfacing Josephson circuitry to classical CMOS circuits operating at ~70 K or higher); and (3) as connections between the ~4 K environment and much lower temperatures (e.g., for control of qubits in a quantum computer operating at ~20 mK).

As an example, FIG. 1 shows an approximate temperature profile of an interconnect 104 (e.g., a superconducting ribbon cable) along its length. In this example, the superconducting ribbon cable is shown with 4 sections (e.g., 110, 112, 114, and 116) of normal-metal (e.g., copper, silver, or gold) cladding at several intermediate locations along its length. A schematic of a dilution refrigerator 102 is shown on the left to show the potential physical locations of the actual thermal stages to which each clad section of cable would be thermally tied (e.g., with one end of a copper wire, foil, or braid that is soldered or clamped to the cladding and the other end that is soldered or clamped to the thermal stage) as it makes its way upward through the system. The nonlinear temperature profile between stages may be due to the highly nonlinear thermal conductivity of the cable, which diminishes rapidly with reduced temperature. Using this hierarchical sequence of thermal ties (e.g., 120, 122, 124, and 126) may advantageously minimize the overall burden on the dilution refrigerator, and may also advantageously allow maximum opportunity for hot electrons (e.g., 'quasiparticles') in the superconductors to cool off before the cable terminates at the 20-30 mK qubit sample. For the special case where the warm end of the cable needs to continue above 4 K to terminate at room temperature (e.g., for optoelectronic data links to a classical computer), a 'thermal clamp' to 4 K (e.g., via a liquid helium heat pipe) may be placed very close to the cable's termination so that the superconductor is only 'normal' (e.g., resistive) for a length of 1 or 2 mm. If the superconductor is clad with copper or other highly conductive metal as discussed below, the distance between the thermal clamp and the high-temperature termination could be extended to several centimeters, owing to the lower electrical resistance of copper compared with the normal state resistance of a superconductor such as niobium. Although FIG. 1 shows a certain number of components arranged in a certain manner, there could be more or fewer number of components arranged differently.

In some examples, the above interconnects may be characterized as composite superconductor/normal thin-film flexible cables, wherein the conductive layers are a laminate of a superconductor (such as niobium or niobium nitride) and a highly conductive ductile normal metal such as copper (thickness ranging from 10 nm to arbitrarily thick, depending on the application). Such cables have interesting and useful properties. For example, Nb cables, which are capped (clad) with Cu may have a significantly higher fabrication yield (e.g., they are more tolerant of pits, particles, and asperities on the flexible substrate), substantially higher critical currents, and may withstand many more flexure cycles (e.g., hundreds) compared with unclad Nb cables fabricated on the same polyimide dielectric layers.

Thin-film copper cladding may also facilitate better thermalization of the cable (maintaining it at a uniform well-defined temperature), which may be relevant to using superconducting cables in a vacuum cryostat, where heat transfer is poor. An example of this need for thermalization could occur when one is connecting between two 4 K circuit boards that are spatially separated, where one might be concerned about possible heating of the cable due to radiation from higher-temperature regions of the system.

Figure 2:
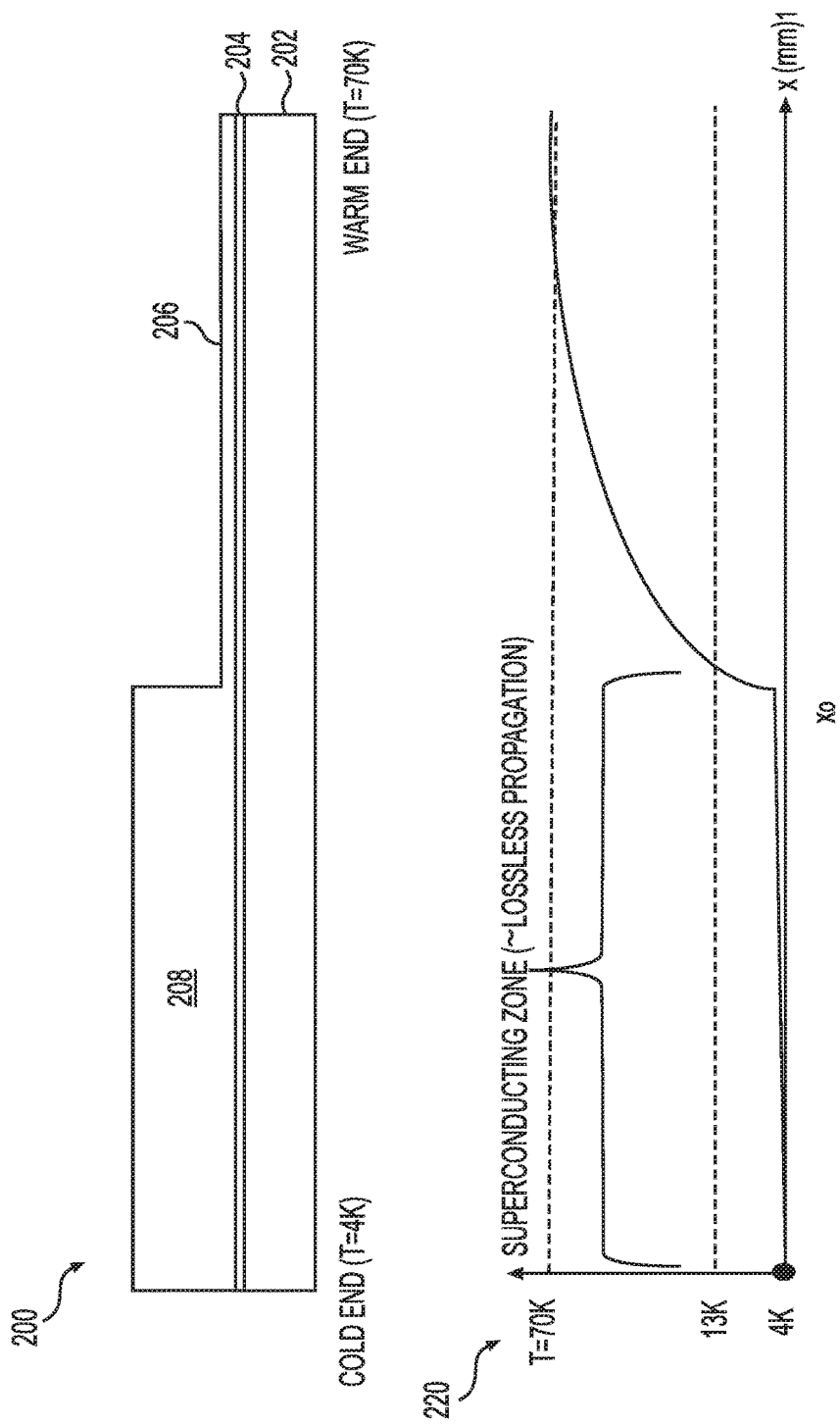
FIG. 2 shows a diagram of thermal clamping for a composite normal/superconducting thin-film conductor in accordance with one example.

When a copper-clad cable containing a superconductor with transition temperature Tc is used to connect between a low-temperature (Tlow<<Tc) module and a high-temperature (Thigh>>Tc) module, there will naturally be a transition region somewhere along the cable where T~Tc, wherein the current shifts smoothly from the superconductor to the normal metal. In one example, by thermally clamping this cable to Tlow (or any other temperature that is substantially below Tc) at some intermediate point along its length, the length of the superconducting zone may be extended, and the length of the normal conducting zone may be reduced. FIG. 2 shows an example of thermal clamping for a composite normal/superconducting thin-film conductor 200 in accordance with one example. In this example, a thick (hence highly thermally conductive) copper film is used to effectuate the maintenance of a low temperature along a substantial length of the conductor 200, without the need for a physical thermal clamp at an intermediate point along the cable. Conductor 200 may further include a polyimide film (e.g., Pyralin PI-2611) 202. In one example, polyimide film 202 may be spin-coated on a glass substrate (not shown). Conductor 200 may further include a niobium layer (e.g., a thin NbN layer) 204. A copper film may be formed on the niobium layer 204. The copper film may include a thick copper portion 208 clamped at the cold end of conductor 200 and a thin copper portion 206 located towards the warm end of conductor 200. Graph 220 of FIG. 2 shows almost lossless propagation of signals even as the temperature rises above the cold end temperature (e.g., 4 K).

Advantageously, thermal clamping may reduce the overall series resistance of the line, which in turn may permit the use of smaller conductor cross sections, and thereby enable one to achieve higher interconnection densities than would otherwise be possible. Thermal clamping may be implemented by applying heat pipes, copper straps, or other techniques at an intermediate position along the line (preferably close to the warmer end of the line). It is also possible to integrate the thermal clamp into the transmission line by using very thick (hence highly thermally conductive) copper cladding from the cold (4K) end of the line to an intermediate position along the line as shown in FIG. 2. This can maintain the thick cladding section below Tc. Beyond that intermediate point, the cladding may transition to a much thinner layer (just sufficient to conduct electrical signals without too much attenuation, but with much lower thermal conductance); this thin region is the segment of line in which the temperature transitions from below Tc up to 70 K at the "hot" end.

Consistent with the example shown in FIG. 2, the thick, high residual resistance ratio (RRR) copper has very good thermal conductivity and so it will maintain the temperature near 4 K. The slight linear ramp, showing an increase in temperature, from one end of the cable (at a temperature of 4K) to the point $x_0$ indicates that even though high-RRR copper has very good thermal conductivity, it isn't infinite. The ramp is approximately linear because the heat flow is a constant down the length of the line (neglecting radiation losses) and the thermal conductivity of the thick Cu is approximately constant since the temperature isn't changing much. Once the cable transitions to the thin metal, the thermal conductivity is much lower and so the temperature rises rapidly for the same amount of current flowing through it. This is because per Wiedemann-Franz law the thermal conductivity of metals is approximately proportional to the product of absolute temperature and electrical resistance. If the electrical resistance is constant over the temperature range of interest, then the thermal conductivity increases approximately in proportion to the change in temperature. This way the temperature gradient at the warm end of the thin metal is less than it is near the cold end (between point $x_0$ to point x). Although FIG. 2 shows a particular change in the thermal conductivity of the metal with temperature between the cold end and the warm end, this is only an example, and the change profile could be different.

When configured as a controlled-impedance transmission line (i.e., micro-strip, strip-line, or coplanar) operating below Tc, copper (or other normal conductor) cladding may effectuate a low-pass filter within the transmission line, where the corner frequency is approximately equal to $R/(2\pi L_K)$, where R is the series resistance of the normal conductor and $L_K$ is the series kinetic inductance of the superconductor. At sufficiently low frequencies, the line may act as a near-perfect superconductor, and so can be used to carry DC bias currents without any loss, as if the copper was not present. However, at sufficiently high frequencies the magnitude of the extra reactance $j\omega L_K$ associated with the superconductor makes it more favorable for radio frequency currents to instead flow through the normal conductor; the line now acts as a normal conductor, as if the superconducting layer was substantially nonexistent. This filtering characteristic may be useful for attenuating electromagnetic noise, e.g., removing thermal noise from higher temperatures, obviating the need to include discrete attenuators in the transmission line. Since a useful quantum computer is expected to have a very large number qubit control lines, the elimination of large banks of discrete attenuators can be quite beneficial. It is of course possible to integrate localized thin-film attenuators into the design of superconducting flex cables by fabricating integrated thin-film resistors, or to flip-chip attach discrete resistor chip arrays to the cables, but the cladding approach may simplify the fabrication process compared with those alternatives.

In one example, a low corner frequency (<<1 GHz) may be preferred, and in this example one preferably may use a high kinetic inductance superconductor such as niobium nitride, and a moderately thick (e.g., 250 nm) copper cladding. Consistent with another example, if one desires a high corner frequency, such as for microwave signal propagation, one would choose a low-kinetic inductance superconductor (usually pure Nb), and thinner copper cladding. An additional degree of freedom may be provided to the transmission line designer by selectively patterning the copper (or other normal conductor) cladding so that it has a different width than the superconductor, instead of the same width. In particular, making the copper cladding width somewhat narrower than the underlying Nb line width may advantageously increase the magnetic inductance associated with current flow through the copper. This could more than offset the kinetic inductance of the superconductor, so that the radio frequency currents continue to pass primarily through the lossless superconductor. In this way, it may be possible to get the thermalization and enhanced reliability benefits that accrue from the copper cladding without excessively sacrificing high-frequency performance.

In one example, in a quantum computer application requiring a connection between 4 K and much lower temperatures (e.g., 20 mK), one may desire to retain this low-pass filtering property while minimizing the axial thermal conductance of the cable, as the copper would present a significant heat leak. This can be accomplished by interrupting the copper cladding at one or more locations so that it does not present a continuous heat conduction path along the cable length. More complex lithographic patterns of the copper cladding and/or of the underlying superconductor can be envisioned that would create specialized filtering and transmission properties, for example Bragg reflectors or metamaterial structures.

In certain examples, it may be preferred to make the radio frequency losses in a superconducting flex cable as small as physically possible. As an example, a large Josephson computer may require relatively long (multiple meters) cables carrying digital signals with frequency content higher than 30 GHz. Alternatively, a quantum computer may be driving large numbers of qubits with individual microwave signals (in the range of ~10 GHz), and any heating of the cables due to microwave losses in the conductors (e.g., due to thermally excited quasiparticles) or dielectric (e.g., due to dielectric loss tangent) may increase the thermal load on the 20 mK dilution refrigerator. For these applications, the presence of any normal metal (cladding or adhesion layer) may be detrimental. However, a 10-nm Ti adhesion layer may be sufficiently thin so as to not discernibly harm the radio frequency performance. In addition, in the case of Nb superconductors on polyimide, the temperature may need to be reduced to 3 K or below in order to have negligible superconducting losses at up to 20 GHz. Moreover, the loss tangent of a typical thin-film polyimide dielectric (i.e., PI-2611 or HD4100) may be much lower than the room temperature value (e.g., tan δ≈0.0002 at 4 K temperatures vs. 0.01 at room temperature), and that the loss tangent may continue to fall to <0.0001 as the temperature is further reduced to 1 K. Accordingly, even if one has a Josephson computer that primarily operates at ~4 K temperatures, it could be beneficial to maintain the longer flexible cables at a somewhat lower temperature than the rest of the computer. For example, long-distance cables may be routed in low-temperature conduits that are maintained at 1 or 2 Kelvin using superfluid helium, helium vapor, or conductive cooling techniques.

Figure 3:
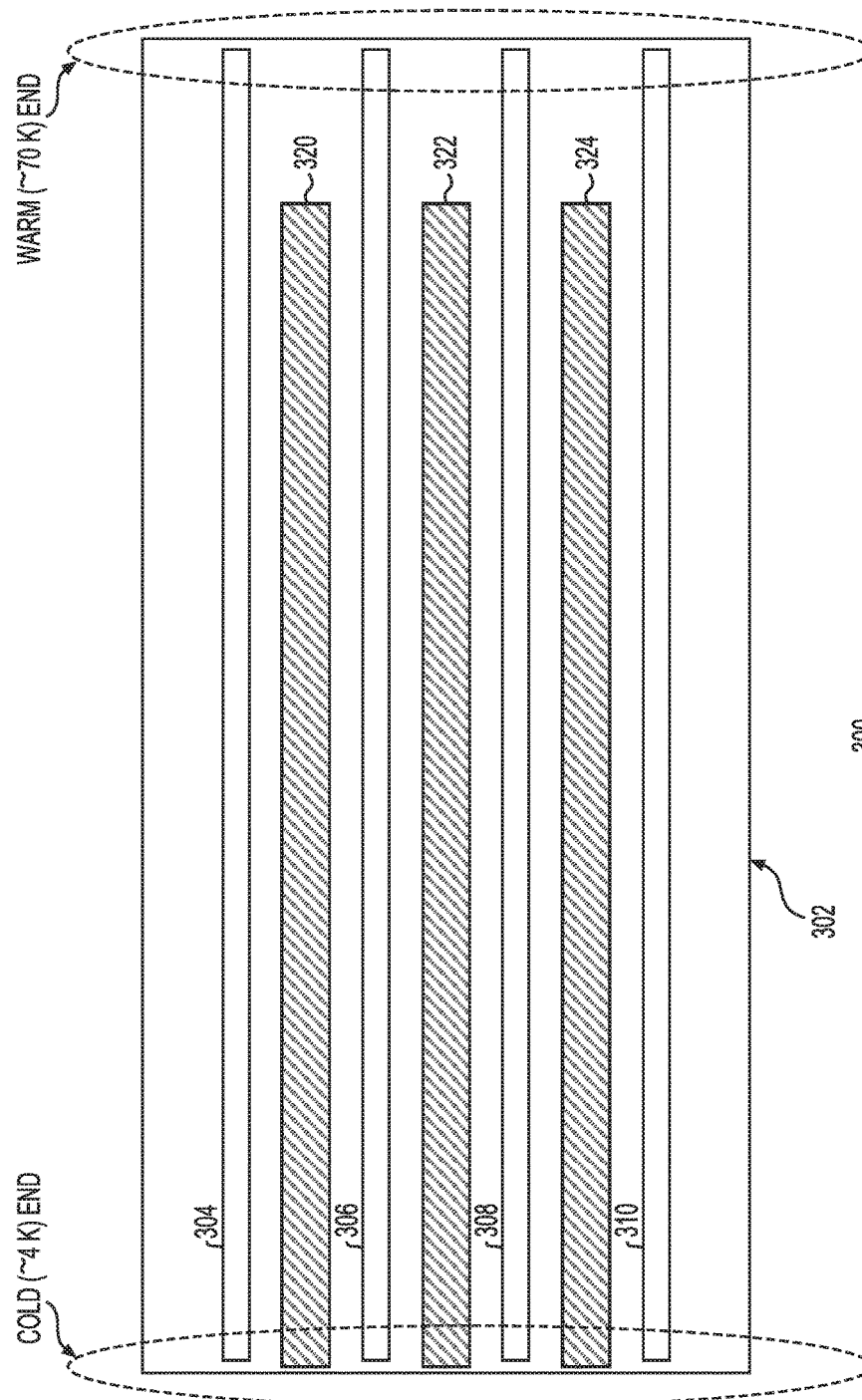
FIG. 3 shows a top view of an interconnect in accordance with one example.

FIG. 3 shows the top view of an example interconnect 300 with vertical differential pairs. The interconnect 300 may be formed on a flexible or a rigid dielectric 302 (e.g., polyimide). Four niobium lines 304, 306, 308, and 310, as shown in FIG. 3, may form the upper halves of four vertical differential pairs for transmitting signals. The niobium (Nb) lines may be optionally clad with a thin layer of Copper. As shown in FIG. 3, one end of the example interconnect may be on the cold end (e.g., approximately 4 K) and the other end may be on the warm end (e.g., approximately 70 K). In addition, as shown in FIG. 3, thick high-RRR Copper films 320, 322, and 324 may be interleaved between the Nb lines carrying the signals. In this example, the Nb signal lines themselves are not clad with a thin layer of Copper because the polyimide or some other dielectric on which these lines are formed may be able to conduct heat laterally to the interleaved Copper so that the Nb signal lines remain sufficiently cold. Although FIG. 3 shows a particular arrangement of conductors and dielectric, other arrangements may also be used.

Figure 4:
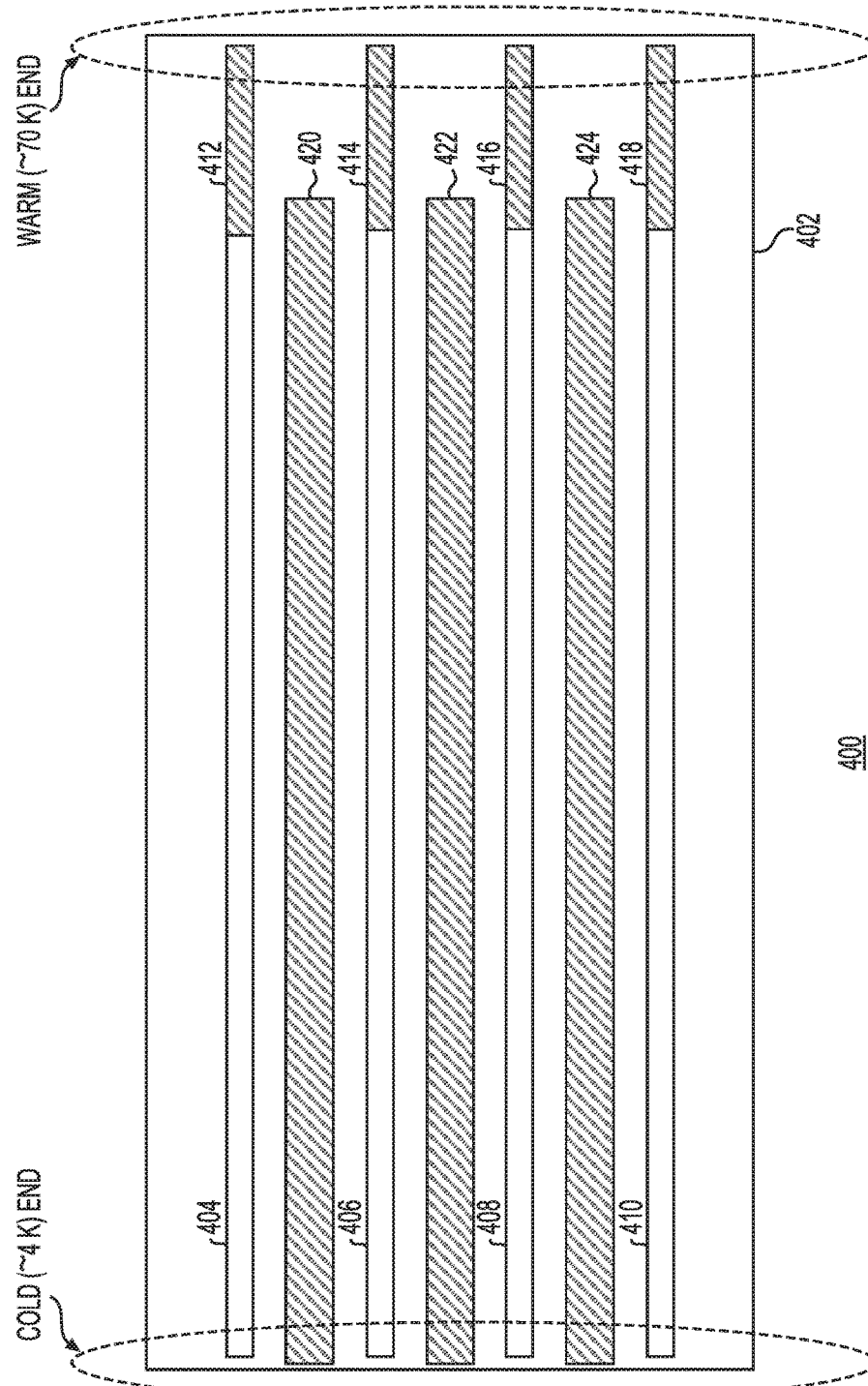
FIG. 4 shows a top view of another interconnect in accordance with one example.

FIG. 4 shows the top view of another example interconnect 400 with vertical differential pairs. The interconnect 400 may be formed on a flexible or a rigid dielectric 402 (e.g., polyimide). Four niobium lines 404, 406, 408, and 410, as shown in FIG. 4, may form the upper halves of four vertical differential pairs for transmitting signals. In this example, the niobium (Nb) lines may be clad with a thin layer of copper for a portion (e.g., portions 412, 414, 416, and 418) of their length. This configuration may be selected when cladding the entire length of the Nb lines may cause too much RF loss. As shown in FIG. 4, one end of the example interconnect may be on the cold end (e.g., approximately 4 K) and the other end may be on the warm end (e.g., approximately 70 K). In this example, thick high-RRR copper films 420, 422, and 424 may be interleaved between the Nb lines carrying the signals. Although FIG. 4 shows certain arrangement of layers, interconnect 400 may comprise additional or fewer layers arranged in a different manner.

Figure 5:
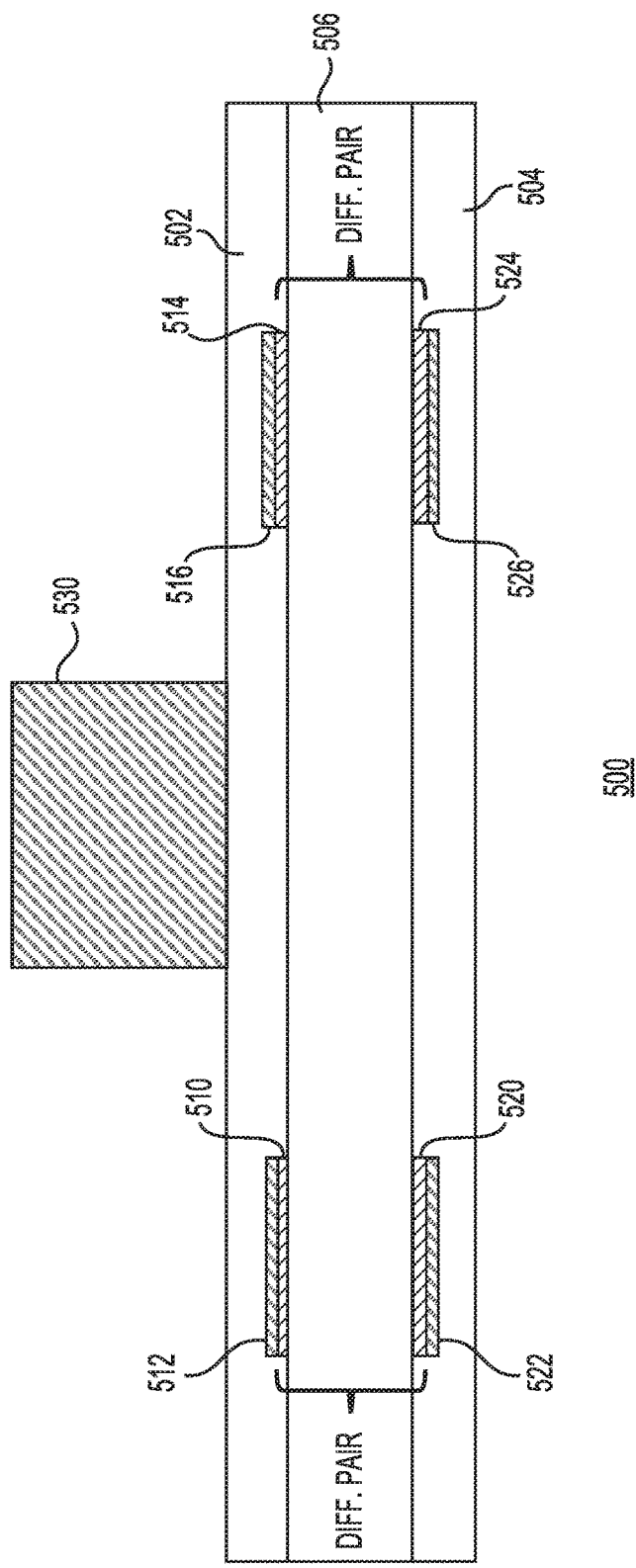
FIG. 5 shows a cross-section view of an interconnect in accordance with one example.

FIG. 5 shows a cross-section view 500 (looking along the length of the cable) of the example interconnect shown in FIG. 4. Cross-section view 500 shows dielectric layers 502, 504, and 506. In this example, each of the dielectric layers 502 and 504 may be approximately 10 microns thick. Dielectric layer 506 may be 20 microns thick. In addition, cross-section view 500 shows the cross-section of differential pairs formed by niobium layers (e.g., 510, 520, 514, and 524) clad with thin layers of copper (e.g., 512, 522, 516, and 526). Each of the niobium and copper layers may be approximately 0.25 microns thick and approximately 18 microns wide. Cross-section view 500 further shows a thick high-RRR copper film 530. In this example, the thick high-RRR copper film may be approximately 25 microns thick. The various dimensions and temperatures described with respect to FIG. 5 are merely examples.

Figure 6:
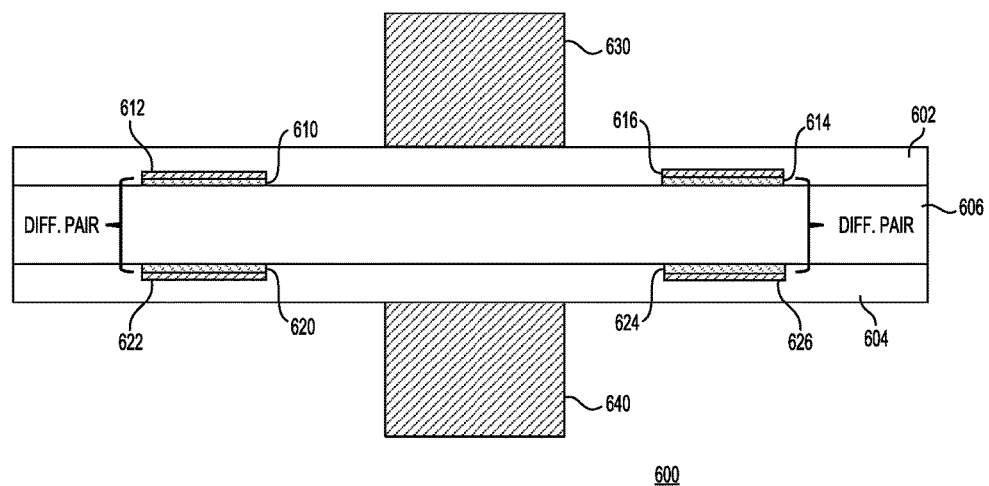
FIG. 6 shows a cross-section view of another interconnect in accordance with one example.

FIG. 6 shows a cross-section view 600 (looking along the length of the cable) of an example interconnect shown in FIG. 3 or FIG. 4, which has been modified from FIG. 5 to include thermal clamps on both sides of the interconnect. Thus, a high-RRR Copper clamp is provided on both the top and the bottom sides of the interconnect. Cross-section view 600 shows dielectric layers 602, 604, and 606. In this example, each of the dielectric layers 602 and 604 may be approximately 10 microns thick. Dielectric layer 606 may be 20 microns thick. In addition, cross-section view 600 shows the cross-section of differential pairs formed by niobium layers (e.g., 610, 620, 614, and 624) clad with thin layers of copper (e.g., 612, 622, 616, and 626). Each of the niobium and copper layers may be approximately 0.25 microns thick and approximately 18 microns wide. Cross-section view 500 further shows a thick high-RRR copper film 630 and another thick high-RRR copper film 640 formed on opposite sides of the interconnect. In this example, the thick high-RRR copper films may be approximately 25 microns thick. The various dimensions and temperatures described with respect to FIG. 6 are merely examples.

Figure 7:
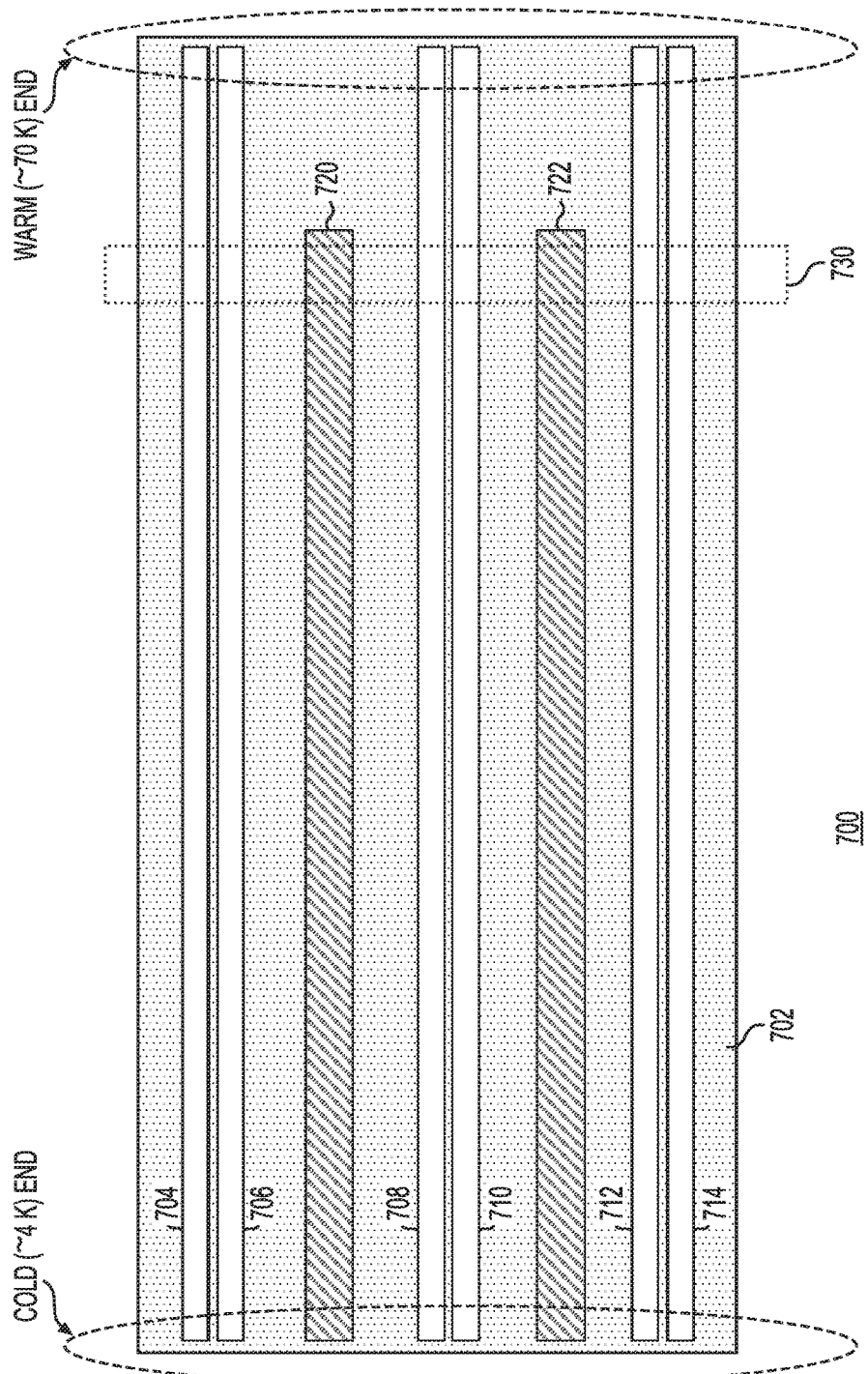
FIG. 7 shows a top view of another interconnect in accordance with one example.

FIG. 7 shows the top view of an example interconnect 700 with coplanar differential pairs. The interconnect 700 may be formed on a flexible or a rigid dielectric 702 (e.g., polyimide). Six niobium lines (e.g., 704, 706, 708, 710, 712, and 714) shown in FIG. 7 may form three coplanar differential pairs (a first pair including niobium lines 704 and 706, a second pair including niobium lines 708 and 710, and a third pair including niobium lines 712 and 714) for transmitting signals. The niobium (Nb) lines are optionally clad with a thin layer of copper. As shown in FIG. 7, one end of the example interconnect may be on the cold end (e.g., approximately 4 K) and the other end may be on the warm end (e.g., approximately 70 K). In this example, thick high-RRR copper films 720 and 722 may be interleaved between the niobium lines carrying the signals. As needed, one end of an external thermal clamp may be applied near the warm end of the interconnect (a possible location for the thermal clamp in FIG. 7 is shown as dotted rectangle 730) and the other end may be connected to a cold plate at 4 K. Although FIG. 7 shows certain arrangement of layers, interconnect 700 may comprise additional or fewer layers arranged in a different manner.

Figure 8:
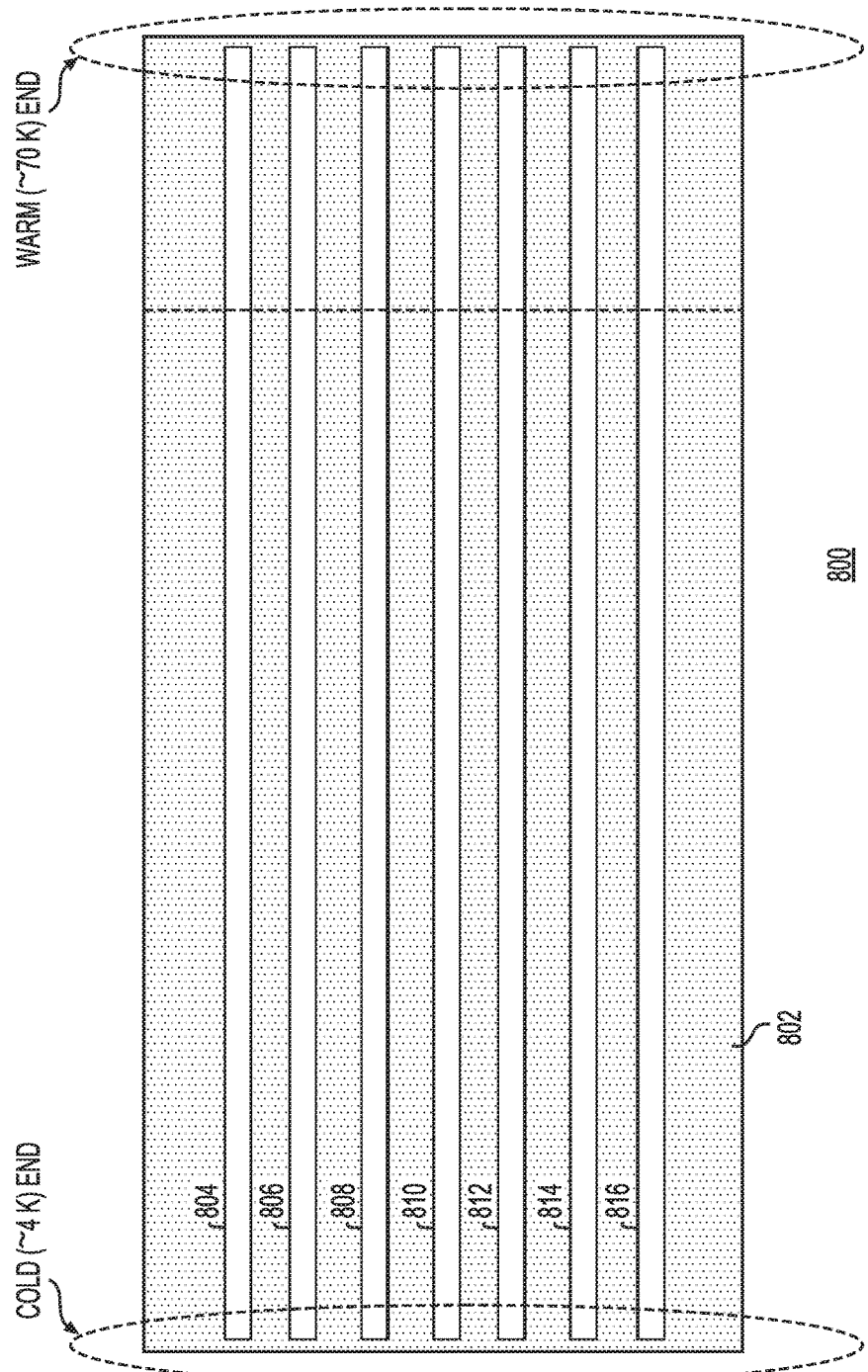
FIGS. 8 and 9 show a top view and a bottom view of another interconnect in accordance with one example.
Figure 9:
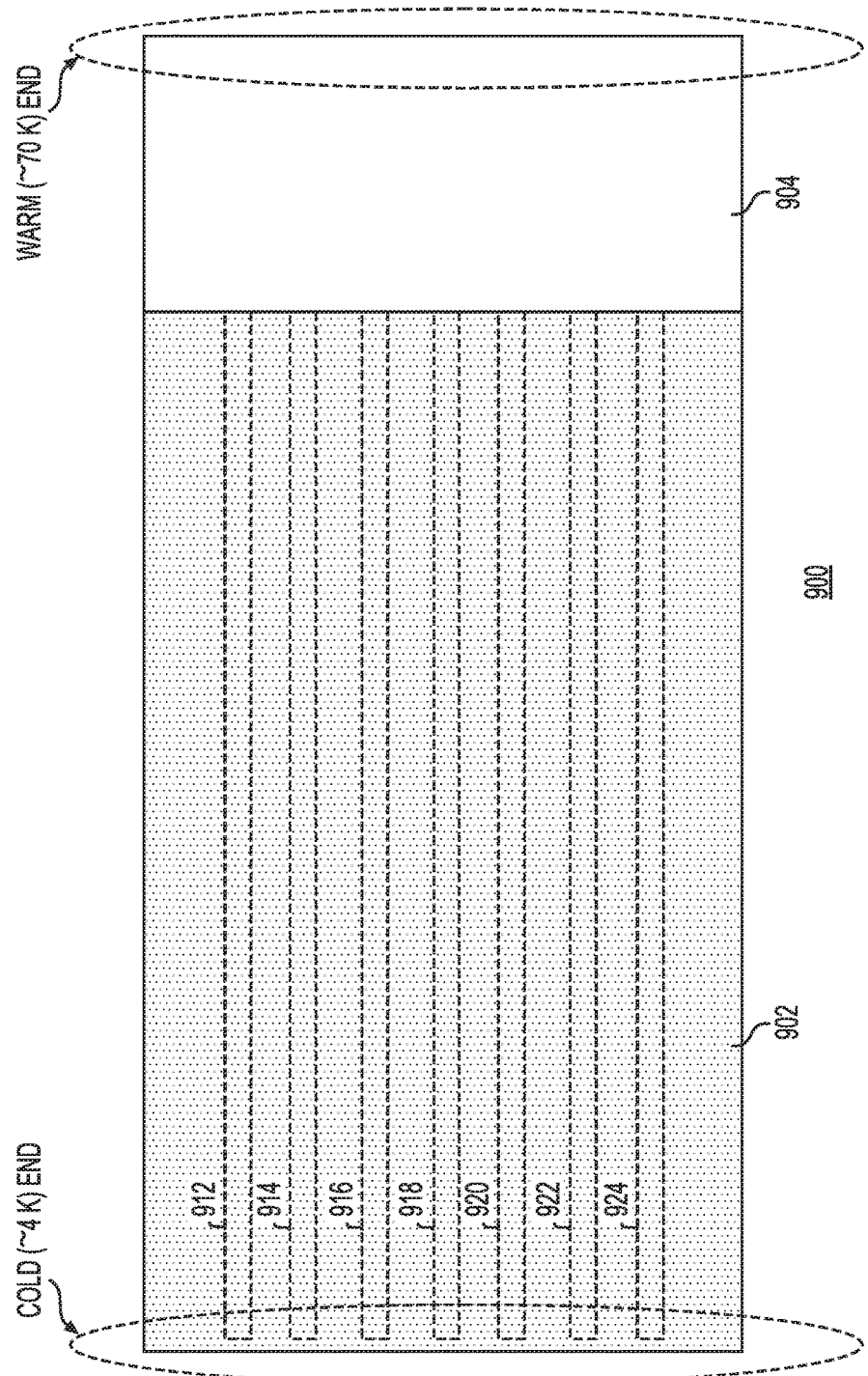

FIGS. 8 and 9 show the top view 800 and the bottom view 900, respectively, of another example interconnect. Top view 800 shows multiple niobium lines (804, 806, 808, 810, 812, 814, and 816) running in parallel, which may be optionally clad with a thin layer of copper. The niobium lines may be formed on a flexible or a rigid dielectric 802 (e.g., polyimide). The bottom view 900 in FIG. 9 shows a thick high-RRR copper plane 902 over a thinner Nb ground plane 904, extending from the cold end towards the warm end and terminating where the thin ground plane 904 (comprising of copper, niobium, or a combination of copper and niobium) continues and which ends at the warm end. In addition, FIG. 9 shows that on the other side of the copper plane are the niobium lines (912, 914, 916, 918, 920, 922, and 924). Although FIG. 8 and FIG. 9 show certain arrangement of layers, the interconnect may comprise additional or fewer layers arranged in a different manner.

Figure 10:
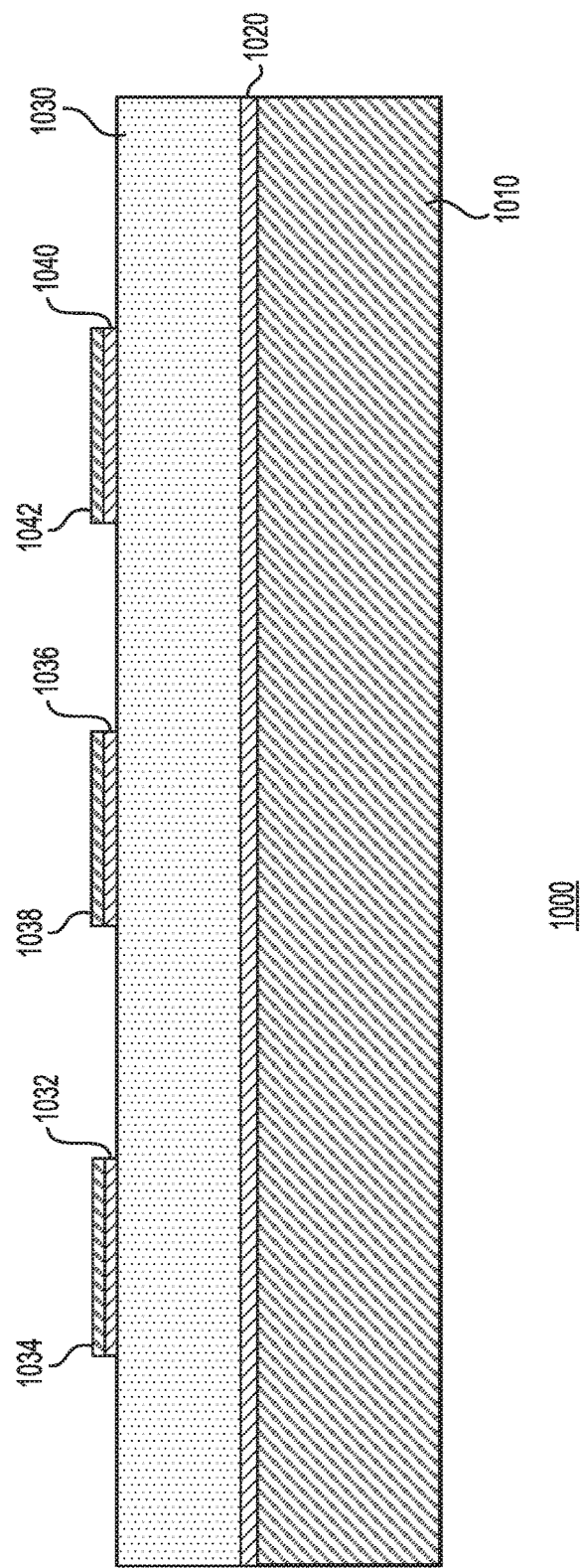
FIG. 10 shows a cross-section view of another interconnect in accordance with one example.

FIG. 10 shows a cross-section view 1000 (looking along the length of the cable including the thermally clamped zone) of the example interconnect shown in FIGS. 8 and 9. Thus, a high-RRR copper clamp 1010 is provided on the bottom side of the interconnect. In this example, copper clamp 1010 may be 20 microns thick. Cross-section view 1000 further shows a niobium layer 1020 formed above the copper clamp 1010. In this example, niobium layer 1020 may be 0.25 microns thick. A dielectric layer 1030 is shown above the niobium layer 1020. In this example, dielectric layer 1030 may be 20 microns thick. In addition, cross-section view 1000 shows cross-section of niobium layers (e.g., 1032, 1036, and 1040) clad with thin layers of copper (e.g., 1034, 1038, and 1042). Each of the niobium and copper layers may be approximately 25 microns thick and approximately 18 microns wide. The various dimensions and temperatures described with respect to FIG. 10 are merely examples.

Figure 11:
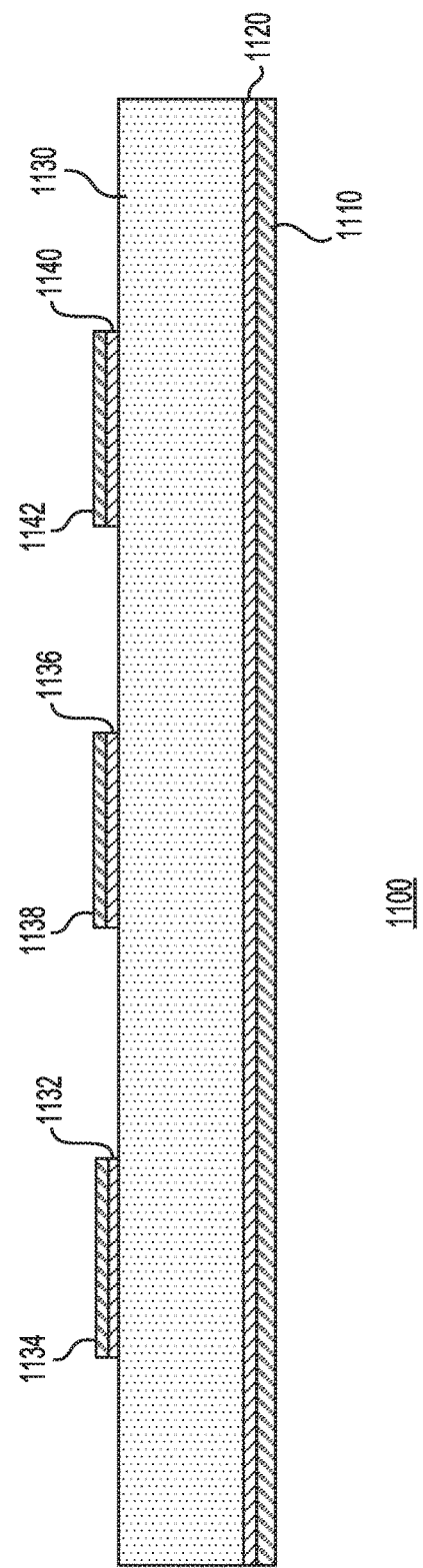
FIG. 11 shows a cross-section view of another interconnect in accordance with one example.

FIG. 11 shows a cross-section view 1100 (looking along the length of the cable including the non-thermally clamped zone) of the example interconnect shown in FIGS. 8 and 9. In this example, copper clamp 1110 may only be 0.25 microns thick. Thus, in the non-thermally clamped zone, the thermal clamp may have a substantially lower thickness than in the thermally clamped zone. Cross-section view 1100 further shows a niobium layer 1120 formed above the copper clamp 1110. In this example, niobium layer 1120 may be 0.25 microns thick. A dielectric layer 1130 is shown above the niobium layer 1120. In this example, dielectric layer 1130 may be 20 microns thick. In addition, cross-section view 1100 shows the cross-section of niobium layers (e.g., 1132, 1136, and 1140) clad with thin layers of copper (e.g., 1134, 1138, and 1142). Each of the niobium and copper layers may be approximately 25 microns thick and approximately 18 microns wide. The various dimensions and temperatures described with respect to FIG. 11 are merely examples.

Figure 12:
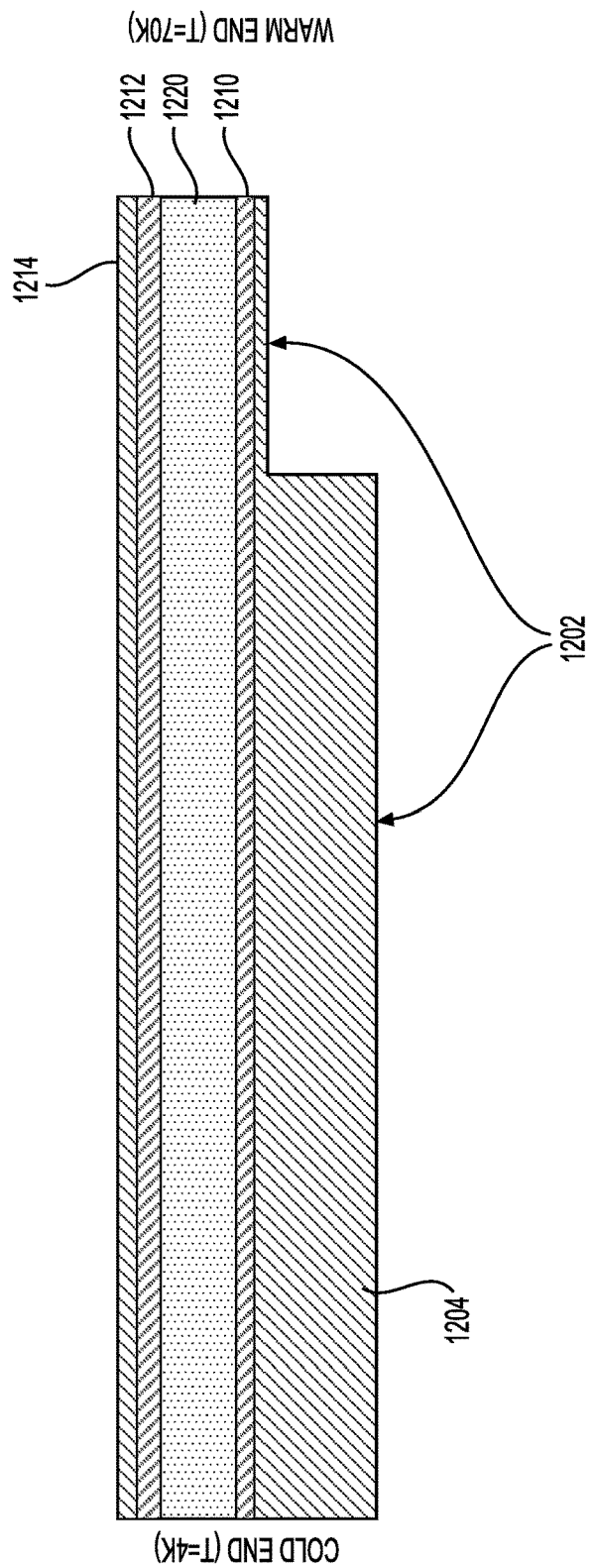
FIG. 12 shows a side view of an interconnect in accordance with one example.

FIG. 12 shows a side-view 1200 of another example interconnect. This example relates to an interconnect (e.g., a microstrip) that is copper cladded (as indicated by reference number 1202) along the entire length of the interconnect. The thickness of the copper cladding is varied along one surface of the interconnect such that a high-RRR (e.g., approximately 250) copper clamp 1204 is provided on the bottom side of the interconnect in the thermally-clamped zone. In one example, the high-RRR copper clamp 1204 may have a thickness of approximately 20 microns in the thermally-clamped zone. The thickness of a low-RRR (e.g., approximately 4) in the non-thermally-clamped zone may be approximately 0.25 microns. The interconnect may further include niobium layers 1210 and 1212. In this example, each of the niobium layers may have a thickness of approximately 0.25 microns. A dielectric layer 1220 may be included between the niobium layers. In this example, dielectric layer 1220 may be a polyimide layer and may have a thickness of approximately 20 microns. A signal layer 1214 may be formed above niobium layer 1212. Signal layer 1214 may be formed using copper and may have a thickness of approximately 0.25 microns. The bottom copper cladding 1202 may also act as a ground layer. The various dimensions and temperatures described with respect to FIG. 12 are merely examples.

Figure 13:
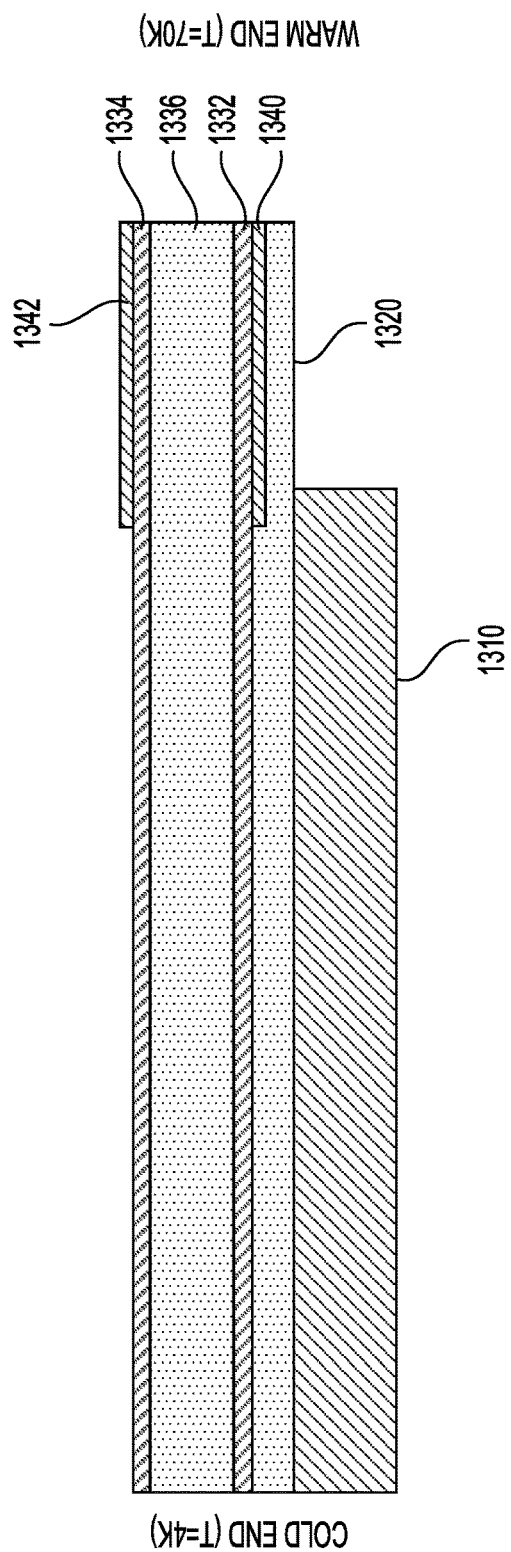
FIG. 13 shows a side view of another interconnect in accordance with one example.

FIG. 13 shows a side view of an example interconnect (e.g., a microstrip) that shows copper cladding of the signal lines and ground plane in the non-thermally clamped zone. This example shows partial copper cladding of the signal layer. The copper cladding may be used to address the degradation of the radio frequency properties of the superconducting signal lines. In this example, the Nb ground plane may be separated from the thick high-RRR copper plane by a dielectric (e.g., polyimide). However, because polyimide has sufficient thermal conductivity, the Nb ground plane may be sufficiently cold even though it is not in direct contact with the thick high-RRR copper plane. In this example, the high-RRR copper clamp 1310 may have a thickness of approximately 20 microns in the thermally-clamped zone. The interconnect may further include niobium layers 1332 and 1334. In this example, each of the niobium layers may have a thickness of approximately 0.25 microns. A dielectric layer 1320 may be included as shown in FIG. 13. Another dielectric layer 1336 may be included between niobium layers 1332 and 1334. In this example, each of dielectric layers 1320 and 1336 may be a polyimide layer. Dielectric layer 1320 may have a thickness of approximately 20 microns. Niobium layer 1334 may act as a signal layer. In this example, niobium layer 1334 may be partially clad with copper layer 1342 and niobium layer 1332 may be partially clad with copper layer 1340. Each of the copper layers 1340 and 1342 may have a thickness of approximately 0.25 microns. The various dimensions and temperatures discussed with respect to FIG. 13 are merely examples.

Figure 14:
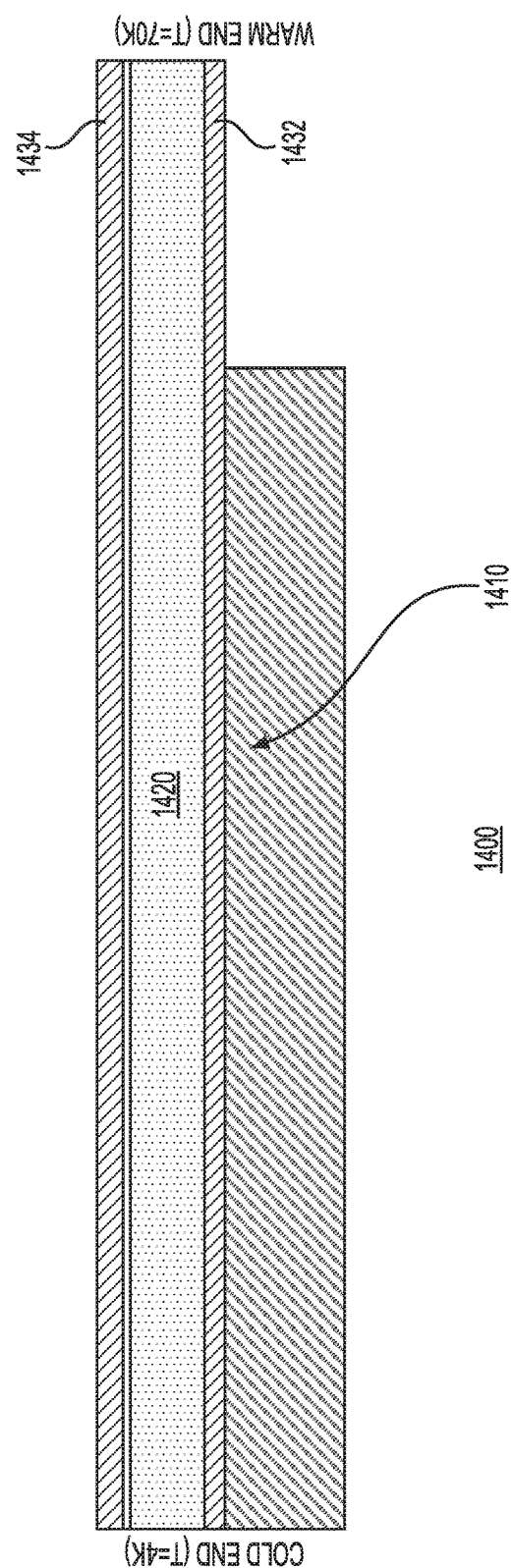
FIG. 14 shows a side view of another interconnect in accordance with one example.

FIG. 14 shows a side view 1400 of an example interconnect (e.g., a microstrip) with no copper cladding in the non-thermally clamped zone. Such an interconnect may be used for very short transition lengths. The provisioning of the copper cladding is varied along one surface of the interconnect such that a high-RRR (e.g., approximately 250) copper clamp 1410 is provided on the bottom side of the interconnect in the thermally-clamped zone. In one example, the high-RRR copper clamp 1410 may have a thickness of approximately 20 microns in the thermally-clamped zone. No copper cladding is provisioned in the non-thermally-clamped zone. The interconnect may further include niobium layers 1432 and 1434. In this example, each of the niobium layers may have a thickness of approximately 0.25 microns. A dielectric layer 1420 may be included between the niobium layers. In this example, dielectric layer 1420 may be a polyimide layer and may have a thickness of approximately 20 microns. Niobium layer 1434 may act as a signal layer. The bottom copper cladding 1410 may also act as a ground layer. The various dimensions and temperatures discussed with respect to FIG. 14 are merely examples.

Figure 15:
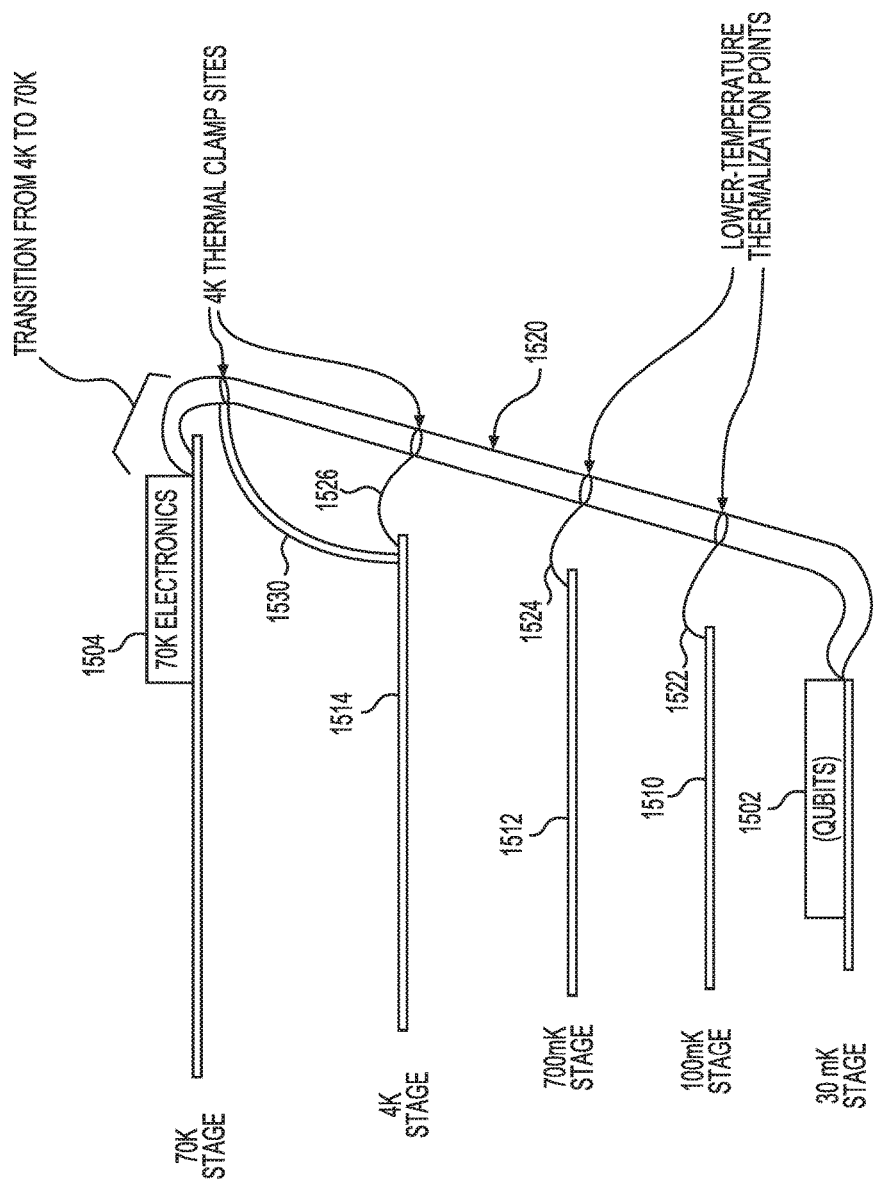
FIG. 15 shows a diagram of a system with interconnects in accordance with one example.

FIG. 15 shows an example of a system 1500 with the interconnects having different thermal clamps or other thermal management structures. The various stages shown in FIG. 15 may relate to a cooling system, such as a dilution refrigerator. As an example, FIG. 15 shows five different temperature stages starting with the warmest stage at approximately 70 K to the coldest stage at approximately 30 mK. The 70 K stage may include electronics 1504, such as CMOS-based devices. The 30 mK stage may include superconducting devices, such as the Qubits sample 1502 shown in FIG. 15. A flexible interconnect 1520 may be used to connect the 70 K electronics 1504 with the Qubits sample 1502. As described earlier with respect to FIG. 1, temperature profile between stages may be nonlinear due to the highly nonlinear thermal conductivity of the cable, which diminishes rapidly with reduced temperature. The thermal transition zone between the 70 K electronics and the 4 K stage may be reduced significantly by using a high thermal conductance path 1530, which may have one end connected vial a thermal clamp to the flexible interconnect 1520 (as shown in FIG. 15) and the other end may be connected to the 4 K stage 1514 (e.g., a cold plate being maintained at approximately 4 K). Another thermal tie 1526 may be used after the thermal clamp to thermally connect the flexible interconnect 1520 with the 4 K stage 1514. Yet another thermal tie 1524 may be used to connect the flexible interconnect 1520 with the 700 mK stage 1512. Finally, another thermal tie 1522 may be used to connect the flexible interconnect 1520 with the 100 mK stage 1510. Using a hierarchical sequence of thermal ties may advantageously minimize the overall burden on the dilution refrigerator, and may also advantageously allow maximum opportunity for hot electrons (e.g., 'quasiparticles') in the superconductors to cool off before the cable terminates at the 30 mK qubit sample. For the case where the warm end of the cable needs to continue above 4 K to terminate at 70 K or room temperature (e.g., for optoelectronic data links to a classical computer), a 'thermal clamp' to 4 K (e.g., via a liquid helium heat pipe) may be placed very close to the cable's termination so that the superconductor is only 'normal' (e.g., resistive) for a length of 1 or 2 mm. If the superconductor is clad with copper or another highly conductive metal, the distance between the thermal clamp and the high-temperature termination could be extended to several centimeters, owing to the lower electrical resistance of copper compared with the normal state resistance of a superconductor such as niobium. Any of the interconnects described with respect to FIGS. 3-14 may be used as part of the system shown in FIG. 15. Although FIG. 15 shows a certain number of components arranged in a certain manner, there could be more or fewer number of components arranged differently. As an example, although FIG. 15 shows a physical thermal clamp, one could alternatively use the thick copper plane as shown in FIG. 13 (for example); in this case, the copper plane would need to extend from the lower 4 K clamp point to the upper 4 K clamp point. This alternative arrangement may work as long as the thermal conductivity of the copper is good enough. If it isn't good enough, the physical thermal clamp may be needed. If a physical thermal clamp is used, one might still also need some copper spanning the distance between the two 4 K clamp points, but it could be much thinner because it's not the main carrier of heat, but only handling heat that is leaking into the cable due to absorption of thermal radiation from the 70 K stage.

Figure 16:
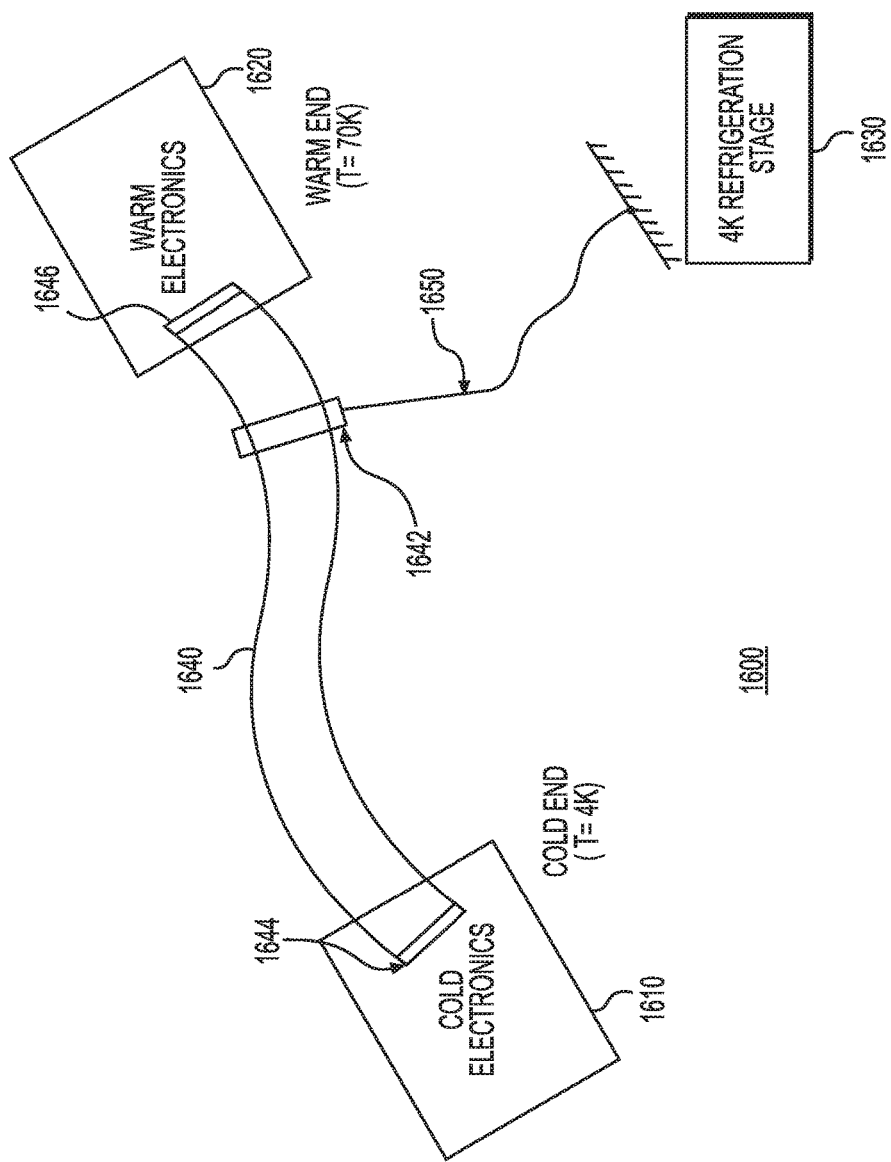
FIG. 16 shows a diagram of a system with an interconnect in accordance with one example.

FIG. 16 shows an example of a system 1600 including a physical thermal clamp 1642 on a flat flexible ribbon cable 1640. One end of the cable 1640 may be connected to the cold end (e.g., approximately at 4 K) via soldering or other techniques for bonding cables, such as flip-chip bonding techniques. In this example, a solder joint 1644 is shown for connecting cable 1640 to cold electronics 1610. The other end of the cable 1640 may be connected to the warm end (e.g., approximately at 70 K) via soldering or other techniques for bonding cables, such as flip-chip bonding techniques. In this example, a solder joint 1646 is shown for connecting cable 1640 to warm end electronics 1620. A physical thermal clamp 1642 may be connected via a "Bobby pin" or a clamp at a point that is closer to the warm end as shown in FIG. 16. The other end of the thermal clamp may be connected to a cold plate or a refrigeration stage 1630, which may be maintained at approximately a temperature of 4 K. The physical connector 1650 interconnecting the thermal clamp site and the cold plate may be implemented as a Copper wire, braid, or foil or as a liquid Helium heat pipe. In this example, assuming a distance between the cold end and the point at which the thermal clamp is connected is x and assuming a distance between the warm end and the point at which the thermal clamp is connected is y, then the ratio of x to y may be in a range between 1 and 100. The flat flexible ribbon cable may include an integrated or internal thermal clamp as well, such as the ones shown in FIGS. 3-14. As an example, if there is a risk of radiant heat transfer to the cable 1640 from higher temperature parts of the cryostat, then an integrated thermal clamp may be included as part of the flat flexible ribbon cable. This is because in this case using only a physical clamp might not be enough to keep the middle of the cable 1640 cold; having the internal thermal clamp providing additional heat conduction would allow heat to conduct to the cold points (either to the 4 K end of the cable 1640, or to the 4 K physical clamp). In that situation, there may not be a need to use nearly as thick copper as may otherwise be required because the amount of heat being conducted may be much less (only stray heat from thermal radiation). Although FIG. 16 shows a certain number of components arranged in a certain manner, there could be more or fewer number of components arranged differently.

FIG. 17 shows a system 1700 that includes both a classical computer system (e.g., classical computer 1710) and a superconducting system 1730 (e.g., including superconducting MCM 1732, the chips mounted to the superconducting MCM, the Qubit wafer, and the chips mounted to the Qubit wafer) operating in a cryogenic environment along with one example of the use of thermal clamps. Classical computer 1710 may operate at air or room temperature and may be coupled via high-speed short-reach optical cables (e.g., cables 1712 and 1714) to a VCSEL array 1776 and a photo-detector array 1782 via gradient-index lens array windows (e.g., windows 1716 and 1718). A cryostat wall 1720 may be used to isolate the cryogenic environment from the room temperature environment. DC power supply cables 1774 may be used to provide DC power to the components of superconducting system 1730 and microwave power supply cables 1772 may be used to provide microwave power to the components of superconducting system 1730.

Still referring to FIG. 17, in this example, the qubits are arranged as a 2-D array (pitch<200 microns to maintain a wafer diagonal<~300 mm) on (or near) the top face of a single monolithic wafer (e.g., qubit wafer 1770) of silicon or sapphire. The 20 mK cold plate 1790 is thermally strapped to the mixing chamber (e.g., the hermetic helium (He) heat transfer bath 1780) of the dilution refrigerator. Some basic interface circuitry may reside on the qubit wafer itself; more complex interface circuitry (if possible, with some error correction and multiplexing functionality) may reside on Josephson circuit chips (e.g., chips 1750, 1752, 1754, 1756, 1758, and 1760) which are flip-chip attached (circuit face down) in a closely tiled array (e.g., 20×20=400 chips). In this example, the chips have through-vias to their back sides, where flexible superconducting ribbon cables (e.g., any of the interconnects described earlier), each may be ~1000 signals wide, are attached. These cables may be routed through radiation shields to a high-performance Josephson computer (many chips (e.g., 1734, 1736, 1738, 1740, 1742, and 1744) flip-mounted on a superconducting multi-chip module 1732) operating at ~4.2 K; this performs further processing and has MUX/DEMUX circuitry so that the relatively 'slow' qubits (switching times several ns) can interface to 10, 20, or even 40 GHz digital data rates.

With continued reference to FIG. 17, this high-speed data stream couples to optical transceiver modules (e.g., VCSEL array 1776 and photo-detector array 1782) via another set of superconducting ribbon cables (200, 100, or 50 cables, respectively, depending on the choice of data rate); each may be ~1000 unidirectional signals wide, for a total bidirectional data rate of ~1 Pbit/s. The optical transceiver modules operate at room temperature, so special thermal clamping near each cable termination may be required to minimize the non-superconducting length and manage the resultant heat leak. As an example, FIG. 17 shows two thermal clamps 1792 connecting the optical transceiver modules (located on the chilled water cold plate 1728, which is the warm end) to the superconducting multi-chip-module (MCM) 1732, which is on the cold end (approximately at a temperature of 4.2 K). Any of the thermal clamp arrangements described earlier may be incorporated as part of this system. In addition, the cables (e.g., cable 1724) connecting the Qubit interface circuits and the Josephson logic may be any of the interconnects described earlier with integrated thermal clamps or thermal plates, as needed. A free-space optical link into a lens array couples the light through the wall of the cryostat to an optical fiber bundle which connects to the classical computer. Although FIG. 17 shows a certain number of components arranged in a certain manner, there could be more or fewer number of components arranged differently.

In certain examples, the systems mentioned in this disclosure may be interconnected to provide a computing environment, such as the computing environment in a datacenter for providing, among other services, cloud-based services, such as software as a service or platform as a service.

In conclusion the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system, such that during operation of the superconducting system and the non-superconducting system, a first portion of the interconnect near the first end having a first temperature equal to or below the critical temperature of the superconducting element, a second portion of the interconnect near the second end having a second temperature above the critical temperature of the superconducting element, and where the interconnect is further configured to reduce a length of the second portion such that temperature substantially over an entire length of the interconnect is maintained at a temperature equal to or below the critical temperature of the superconducting element.

The interconnect may include a first layer comprising at least the superconducting element, a second layer comprising at least the superconducting element, and a third layer comprising a dielectric material formed between the first layer and the second layer. The interconnect may further include fourth layer comprising a non-superconducting metal element formed adjacent to the first layer and a fifth layer comprising a non-superconducting metal element formed adjacent to the second layer. A thickness of the fifth layer may be varied along a length-wise direction of the interconnect to reduce the length of the second portion such that almost the entire length of the interconnect is maintained at the temperature equal to or below the critical temperature of the superconducting element. In one example, the variation in thickness may be a step-wise variation as described earlier. A thickness of the fifth layer may be varied along a length-wise direction of the interconnect such that a ratio of a first thickness of the fifth layer in the first portion of the interconnect to a second thickness of the fifth layer in the second portion of the interconnect is at least five.

A first end of a thermal tie may be connected to the interconnect and a second end of the thermal tie may be connected to a cold plate. The superconducting element may be niobium and the non-superconducting element may be copper, silver, gold, or titanium. The critical temperature may be in a range of 4 Kelvin to 77 Kelvin.

In another example, the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system. The interconnect may further comprise a first layer comprising at least the superconducting element and a second layer comprising a non-superconducting metal element, where a thickness of the second layer is varied along a length-wise direction of the interconnect such that during operation of the superconducting system and the non-superconducting system temperature substantially over an entire length of the interconnect is maintained at a temperature equal to or below the critical temperature of the superconducting element.

A first portion of the interconnect near the first end may have a first temperature equal to or below the critical temperature of the superconducting element, a second portion of the interconnect near the second end may have a second temperature above the critical temperature of the superconducting element, and a thickness of the second layer may be varied along a length-wise direction of the interconnect such that a ratio of a first thickness of the second layer in a first portion of the interconnect to a second thickness of the second layer in the second portion of the interconnect may be at least five.

The interconnect may further comprise a third layer comprising a dielectric. The superconducting element may be niobium and the non-superconducting element may be copper, silver, gold, or titanium. The critical temperature may be in a range of 4 Kelvin to 77 Kelvin.

In another example, the present disclosure relates to an interconnect for coupling a superconducting system and a non-superconducting system. The interconnect may comprise a first end configured for coupling to the superconducting system, where the interconnect comprises a superconducting element having a critical temperature. The interconnect may further comprise a second end configured for coupling to the non-superconducting system. The interconnect may further comprise a first layer comprising a dielectric, the first layer having a first edge along a length-wise direction of the interconnect and a second edge opposite to the first edge along the length-wise direction of the interconnect. The interconnect may further comprise a first differential pair of superconductors comprising at least the superconducting element, the first differential pair formed along the length-wise direction of the interconnect and the first differential pair formed closer to the first edge than the second edge. The interconnect may further comprise a second differential pair of superconductors comprising at least the superconducting element, the second differential pair formed along the length-wise direction of the interconnect and the second differential pair formed closer to the second edge than the first edge. The interconnect may further comprise a non-superconductor metal formed along the length-wise direction of the interconnect, between the first differential pair and the second differential pair, where a thickness of the non-superconductor metal is selected such that during operation of the superconducting system and the non-superconducting system temperature substantially over an entire length of the interconnect is maintained at a temperature equal to or below the critical temperature of the superconducting element.

The dielectric may comprise polyimide. The superconducting element may be niobium and the non-superconducting element may be copper, silver, gold, or titanium. The critical temperature may be in a range of 4 Kelvin to 77 Kelvin.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. An interconnect for coupling a superconducting system and a non-superconducting system, the interconnect comprising:
   a first end configured for coupling to the superconducting system, wherein the interconnect comprises a superconducting element having a critical temperature; and
   a second end configured for coupling to the non-superconducting system, such that during operation of the superconducting system and the non-superconducting system, a first portion of the interconnect near the first end having a first temperature equal to or below the critical temperature of the superconducting element, a second portion of the interconnect near the second end having a second temperature above the critical temperature of the superconducting element, and wherein the interconnect is further configured to reduce a length of the second portion such that temperature substantially over an entire length of the interconnect is maintained at a temperature equal to or below the critical temperature of the superconducting element.

2. The interconnect of claim 1, wherein the interconnect comprises a first layer comprising at least the superconducting element, a second layer comprising at least the superconducting element, and a third layer comprising a dielectric material formed between the first layer and the second layer.

3. The interconnect of claim 2, wherein the interconnect comprises a fourth layer comprising a non-superconducting metal element formed adjacent to the first layer and a fifth layer comprising a non-superconducting metal element formed adjacent to the second layer.

4. The interconnect of claim 3, wherein a thickness of the fifth layer is varied along a length-wise direction of the interconnect to reduce the length of the second portion such that almost the entire length of the interconnect is maintained at the temperature equal to or below the critical temperature of the superconducting element.

5. The interconnect of claim 3, wherein a thickness of the fifth layer is varied along a length-wise direction of the interconnect such that a ratio of a first thickness of the fifth layer in the first portion of the interconnect to a second thickness of the fifth layer in the second portion of the interconnect is at least five.

6. The interconnect of claim 2, wherein a first end of a thermal tie is connected to the interconnect and a second end of the thermal tie is connected to a cold plate.

7. The interconnect of claim 1, wherein the superconducting element comprises niobium.

8. The interconnect of claim 1, wherein the critical temperature corresponds to a temperature in a range of 4 Kelvin to 77 Kelvin.

9. The interconnect of claim 3, wherein the non-superconducting metal element comprises copper, silver, gold, or titanium.

10. An interconnect for coupling a superconducting system and a non-superconducting system, the interconnect comprising:
    a first end configured for coupling to the superconducting system, wherein the interconnect comprises a superconducting element having a critical temperature; and
    a second end configured for coupling to the non-superconducting system, wherein the interconnect further comprises:
      a first layer comprising at least the superconducting element,
      a second layer comprising a non-superconducting metal element, wherein a thickness of the second layer is varied along a length-wise direction of the interconnect such that during operation of the superconducting system and the non-superconducting system temperature substantially over an entire length of the interconnect is maintained at a temperature equal to or below the critical temperature of the superconducting element.

11. The interconnect system of claim 10, wherein a first portion of the interconnect near the first end having a first temperature equal to or below the critical temperature of the superconducting element, a second portion of the interconnect near the second end having a second temperature above the critical temperature of the superconducting element, and wherein a thickness of the second layer is varied along a length-wise direction of the interconnect such that a ratio of a first thickness of the second layer in a first portion of the interconnect to a second thickness of the second layer in the second portion of the interconnect is at least five.

12. The interconnect of claim 10 further comprising a third layer comprising a dielectric.

13. The interconnect of claim 10, wherein the critical temperature corresponds to a temperature in a range of 4 Kelvin to 77 Kelvin.

14. The interconnect of claim 10, wherein the superconducting element comprises niobium.

15. The interconnect of claim 10, wherein the non-superconducting metal element comprises copper, silver, gold, or titanium.

16. An interconnect for coupling a superconducting system and a non-superconducting system, the interconnect comprises:
  a first end configured for coupling to the superconducting system, wherein the interconnect comprises a superconducting element having a critical temperature; and
  a second end configured for coupling to the non-superconducting system, wherein the interconnect further comprises:
    a first layer comprising a dielectric, the first layer having a first edge along a length-wise direction of the interconnect and a second edge opposite to the first edge along the length-wise direction of the interconnect,
    a first differential pair of superconductors comprising at least the superconducting element, the first differential pair formed along the length-wise direction of the interconnect and the first differential pair formed closer to the first edge than the second edge,
    a second differential pair of superconductors comprising at least the superconducting element, the second differential pair formed along the length-wise direction of the interconnect and the second differential pair formed closer to the second edge than the first edge, and
    a non-superconductor metal formed along the length-wise direction of the interconnect, between the first differential pair and the second differential pair, wherein a thickness of the non-superconductor metal is selected such that during operation of the superconducting system and the non-superconducting system temperature substantially over an entire length of the interconnect is maintained at a temperature equal to or below the critical temperature of the superconducting element.

17. The interconnect of claim 16, wherein the critical temperature corresponds to a temperature in a range of 4 Kelvin to 77 Kelvin.

18. The interconnect of claim 16, wherein the superconducting element comprises niobium.

19. The interconnect of claim 18, wherein the non-superconducting metal element comprises copper, silver, gold, or titanium.

20. The interconnect of claim 19, wherein the dielectric comprises polyimide.

* * * * *